US007989736B2

(12) United States Patent
Park et al.

(10) Patent No.: US 7,989,736 B2
(45) Date of Patent: Aug. 2, 2011

(54) SYSTEM FOR HEAT TREATMENT OF SEMICONDUCTOR DEVICE

(75) Inventors: Wang Jun Park, Seoul (KR); Jung Bae Kim, Seoul (KR); Young Jae Ahn, Seoul (KR); Hyoung June Kim, Seoul (KR); Dong Hoon Shin, Seoul (KR)

(73) Assignee: Viatron Technologies Inc. (KR)

( * ) Notice: Subject to any disclaimer, the term of this patent is extended or adjusted under 35 U.S.C. 154(b) by 1267 days.

(21) Appl. No.: 11/598,447

(22) Filed: Nov. 13, 2006

(65) Prior Publication Data
US 2007/0122936 A1 May 31, 2007

(30) Foreign Application Priority Data

| May 12, 2004 | (KR) | ......................... 10-2004-0033617 |
| Feb. 28, 2005 | (KR) | ......................... 10-2005-0017004 |
| Feb. 28, 2005 | (KR) | ......................... 10-2005-0017005 |
| Apr. 1, 2005 | (KR) | ......................... 10-2005-0027742 |
| May 12, 2005 | (WO) | ................ PCT/KR2005/001393 |

(51) Int. Cl.
*H01L 21/02* (2006.01)
*F27B 9/12* (2006.01)
*F27B 9/36* (2006.01)
*F27B 9/39* (2006.01)

(52) U.S. Cl. ........ 219/388; 219/601; 219/649; 219/653; 219/655; 118/724; 118/729; 118/723 I

(58) Field of Classification Search .......................... None
See application file for complete search history.

(56) References Cited

U.S. PATENT DOCUMENTS

| 2,188,401 | A | * | 1/1940 | Crowley ......................... 65/161 |
| 4,263,336 | A | | 4/1981 | Thompson et al. |
| 5,356,476 | A | * | 10/1994 | Foster et al. ................... 118/725 |

(Continued)

FOREIGN PATENT DOCUMENTS

JP  02-159080  6/1990

(Continued)

OTHER PUBLICATIONS

Office Action, Japanese Patent Office, Nov. 16, 2010.

*Primary Examiner* — Joseph M Pelham
(74) *Attorney, Agent, or Firm* — Park & Associates IP Law, P.C.

(57) ABSTRACT

Disclosed is a heat treatment system for semiconductor devices. The heat treatment system is used in a heat treatment process for semiconductor devices, such as a crystallization process for an amorphous silicon thin film or a dopant activation process for a poly-crystalline silicon thin film formed on a surface of a glass substrate of a flat display panel including a liquid crystal display (LCD) or an organic light emitting device (OLED). The heat treatment system transfers a semiconductor device after uniformly preheating the semiconductor device in order to prevent deformation of the semiconductor device during the heat treatment process, rapidly performs the heat treatment process under the high temperature condition by heating the semiconductor device using a lamp heater and induction heat derived from induced electromotive force, and unloads the semiconductor device after uniformly cooling the semiconductor device such that the semiconductor device is prevented from being deformed when the heat treatment process has been finished. The heat treatment system rapidly performs the heat treatment process while preventing deformation of the semiconductor device by gradually heating or cooling the semiconductor device.

51 Claims, 19 Drawing Sheets

U.S. PATENT DOCUMENTS

| | | | | |
|---|---|---|---|---|
| 5,827,773 | A * | 10/1998 | Voutsas | 438/488 |
| 6,747,254 | B2 * | 6/2004 | Kim et al. | 219/635 |
| 2003/0010775 | A1 * | 1/2003 | Kim | 219/634 |
| 2003/0197007 | A1 * | 10/2003 | Kim et al. | 219/635 |

FOREIGN PATENT DOCUMENTS

| | | |
|---|---|---|
| JP | 05-161961 A | 6/1993 |
| JP | 06-315625 | 11/1994 |
| JP | 08-107067 A | 4/1996 |
| JP | 2000-082677 A | 3/2000 |
| JP | 2000-331986 A | 11/2000 |
| JP | 2002-110581 A | 4/2002 |
| JP | 2002-198322 A | 7/2002 |
| JP | 2002-261040 A | 9/2002 |
| JP | 2003-051505 A | 2/2003 |
| JP | 2003-092267 A | 3/2003 |
| JP | 2003-124206 A | 4/2003 |
| JP | 2003-318182 A | 11/2003 |
| KR | 10-2000-0033084 A | 6/2000 |
| KR | 10-2003-0000294 A | 1/2003 |
| KR | 10-2003-0016546 A | 3/2003 |
| KR | 10-2003-0083099 A | 10/2003 |

* cited by examiner

SYSTEM FOR HEAT TREATMENT OF SEMICONDUCTOR DEVICE

TECHNICAL FIELD

The present invention relates to a heat treatment system for semiconductor devices. More particularly, the present invention relates to a heat treatment system for semiconductor devices used in a heat treatment process, such as a crystallization process for an amorphous silicon thin film or a dopant activation process for a poly-crystalline silicon thin film formed on a surface of a glass substrate of a flat display panel including a liquid crystal display (LCD) or an organic light emitting device (OLED), wherein the heat treatment system according to the present invention transfers a semiconductor device after uniformly preheating the semiconductor device in order to prevent deformation of the semiconductor device during the heat treatment process, rapidly performs the heat treatment process under the high temperature condition by heating the semiconductor device using a lamp heater and induction heat derived from induced electromotive force, and unloads the semiconductor device after uniformly cooling the semiconductor device such that the semiconductor device is prevented from being deformed when the heat treatment process has been finished. Thus, the heat treatment system of the present invention can rapidly perform the heat treatment process while preventing deformation of the semiconductor device by gradually heating or cooling the semiconductor device.

BACKGROUND ART

Among flat display devices, a liquid crystal display (LCD) or an organic light emitting display (OLED) is an active device including a thin film transistor formed on a surface of a glass substrate. In general, such a thin film transistor is fabricated through various steps of depositing an amorphous silicon thin film on a surface of a transparent glass substrate or a quartz substrate, crystallizing the amorphous silicon thin film into a crystalline silicon thin film, and activating the crystalline silicon thin film by implanting a dopant into the crystalline silicon thin film.

Generally, the amorphous silicon thin film is deposited on the glass substrate through a chemical vapor deposition (CVD) process and is crystallized into a poly-crystalline silicon thin film through a predetermined heat treatment process. In addition, the dopant is doped into the poly-crystalline silicon thin film in order to activate the poly-crystalline silicon thin film.

The amorphous silicon thin film deposited on the glass substrate can be crystallized through various crystallization processes, such as a solid phase crystallization (SPC) process, a metal induced crystallization (MIC) process, and an excimer laser crystallization (ELC) process.

According to the SPC process, a heat treatment process is carried out at a predetermined temperature in order to crystallize the amorphous silicon thin film. In general, the glass substrate formed with the amorphous silicon thin film is subject to the heat treatment process at the temperature above 600° C.

According to the MIC process, a predetermined metal element is added to the amorphous silicon thin film in order to crystallize the amorphous silicon thin film at a relatively low temperature. However, if the heat treatment temperature is too low, a grain size may be reduced and crystallinity thereof may be degraded, thereby lowering driving characteristics of the semiconductor device. In particular, if the added metal element is introduced into a channel area of a transistor, current leakage may be increased. In order to solve the above problem of the MIC process, a metal induced lateral crystallization (MILC) process has been developed. However, according to the MILC process, the heat treatment process must be carried out at the temperature above 500° C. in order to induce the lateral crystallization.

According to the ELC process, the amorphous silicon thin film formed on the glass substrate is instantly melted by means of high-energy laser irradiated onto the amorphous silicon thin film and the melted silicon thin film is again cooled, thereby crystallizing the amorphous silicon thin film. Although the ELC process can crystallize the amorphous silicon thin film without deforming the glass substrate, a line pattern bonding may be created due to the high-energy laser or an uneven crystalline phase may occur if high-energy laser is unevenly irradiated onto the amorphous silicon thin film, thereby lowering driving characteristics of the semiconductor device. In addition, the ELC process requires expensive equipment, so the ELC process increases the initial investment cost while presenting limitations to produce the semiconductor devices in mass production.

In the meantime, after the above crystallization process has been performed, the thin film transistor employing the poly-crystalline silicon thin film may be subject to additional processes of implanting a predetermined metal element into the poly-crystalline silicon thin film as a dopant and activating the dopant.

In general, a dopant, such as arsenic, phosphorus, or boron, is doped into a predetermined portion of the poly-crystalline silicon thin film through an ion implantation process or a plasma doping process in order to form an n-type area or a p-type area, such as a source and drain area, in the thin film transistor. After that, the dopant is activated by means of laser or the heat treatment process.

Similarly to the crystallization process for the amorphous silicon thin film, the laser or the heat treatment process is carried out in order to activate the dopant. For instance, an excimer laser annealing (ELA) process, a rapid thermal annealing (RTA) process, or a furnace annealing (FA) process can be performed to activate the dopant.

According to the ELA process, the dopant is activated through a mechanism identical to that of ELC process used for crystallizing the amorphous silicon thin film, in which the dopant may be activated while the amorphous silicon thin film is being rapidly melted and crystallized by means of nano-second pulses. Thus, the ELA process also has the problems represented in the ELC process. That is, the ELA process may cause thermal stress to the poly-crystalline silicon thin film if the amorphous silicon thin film is unevenly crystallized or melted due to high-energy laser unevenly irradiated onto the amorphous silicon thin film, thereby degrading reliability of the semiconductor device.

According to the RTA process, the glass substrate is subject to the heat treatment process at the temperature above 600° C. by using a heating source, such as a tungsten-halogen lamp or an Xe arc lamp. However, the RTA process may cause deformation of the glass substrate if the heat treatment process is continuously performed more than several minutes at the temperature above 600° C. In contrast, if the heat treatment process is performed at the temperature below 600° C., the dopant cannot be sufficiently activated, thereby degrading the characteristics of the semiconductor devices.

According to the FA process, the glass substrate formed with the poly-crystalline silicon thin film is maintained under an atmosphere having a predetermined heat treatment temperature for several hours, thereby activating the dopant.

However, the FA process cannot sufficiently activate the dopant if the heat treatment temperature is lowered, thereby degrading reliability of the semiconductor devices. In addition, since the FA process requires several hours of process time, productivity thereof may be lowered.

When the above crystallization processes or the dopant activation processes for the amorphous silicon thin film are carried out, the heat treatment temperature may exert a serious influence upon process time, quality of the poly-crystalline silicon thin film, and reliability of the semiconductor devices.

Generally, the glass substrate used for the LCD or the OLED is a boro-silicate based glass substrate, in which fluidity of glass may increase if it is exposed to an atmosphere having a temperature above 500° C. for a long period of time, so that mechanical strength of the glass substrate is degraded while causing thermal deformation thereof. If a local temperature deviation occurs in the glass substrate, the glass substrate may be seriously deformed or damaged. That is, an inner portion, an edge portion, and an outer portion of the glass substrate may be heated or cooled with mutually different heating or cooling speeds, so a temperature difference may occur therebetween. Thus, the glass substrate is subject to thermal stress due to the temperature difference, so that the glass substrate is easily deformed. In addition, even when the glass substrate is maintained in a constant temperature, if the glass substrate has an uneven temperature distribution, the glass substrate is deformed due to thermal stress or the glass substrate is unevenly shrunk due to the densification behavior, causing deformation of the glass substrate.

For this reason, it is necessary to provide a device capable of preventing deformation of the glass substrate caused by a local temperature deviation and uneven thermal stress when the glass substrate is heat-treated at the temperature above 600° C.

Conventionally, a horizontal continuous furnace or a vertical tube furnace has been used for heat-treating the glass substrate through the SPC process or the MIC process. The glass substrate is moved along an interior of the horizontal continuous furnace having a length of about several tens of meters by means of a conveyer or a roller for the heat treatment process. The horizontal continuous furnace smoothly increases or decreases the temperature of the glass substrate in order to prevent the glass substrate from being deformed or damaged during the heat treatment process, so the total length of the horizontal continuous furnace may be increased. For this reason, the horizontal continuous furnace requires long process time of about several hours or several tens of hours for the heat treatment process. Due to the long process time for the heat treatment process, the horizontal continuous furnace may not significantly increase the heat treatment temperature to avoid the deformation of the glass substrate.

In the meantime, the vertical tube furnace simultaneously performs the heat treatment process with respect to a plurality of glass substrates by vertically mounting plural glass substrates on a quartz boat or a silicon carbide (SiC) boat installed in the vertical tube furnace. The glass substrates are heat-treated by means of heat applied to outer portions of the glass substrates. Thus, the temperature difference may occur between outer portions and inner portions of the glass substrates. In particular, in cases of large-sized glass substrates, there is a great difference of heating and cooling speeds between the outer portions and the inner portions of the glass substrates, so that the glass substrates may be seriously deformed. In addition, contact portions of the glass substrates, which make contact with the boat, may represent the heating and cooling speeds different from those of non-contact portions of the glass substrates, which do not make contact with the boat, so that the glass substrate is unevenly heated or cooled. Therefore, the vertical tube furnace must slowly heat or cool the glass substrates (for example, it heats or cools five glass substrates per one minute) in order to reduce the difference of the heating and cooling speeds between the inner and outer portions of the glass substrates, so relatively long process time is required. In addition, since the glass substrates are installed in the vertical tube furnace while being supported by the boat, if the heat treatment process is performed for a long period of time at the temperature above 500° C., the glass substrates may droop due to the tare thereof, so the vertical tube furnace is not applicable for the dopant activation process or the SPC process, which are performed at the temperature above 600° C., but only applicable for the heat treatment process performed at the temperature below 500° C.

DISCLOSURE OF THE INVENTION

Therefore, the present invention has been made in view of the above-mentioned problems, and it is an object of the present invention to provide a heat treatment system for semiconductor devices used in a heat treatment process, such as a crystallization process for an amorphous silicon thin film or a dopant activation process for a poly-crystalline silicon thin film formed on a surface of a glass substrate of a flat display panel including a liquid crystal display (LCD) or an organic light emitting device (OLED), wherein the heat treatment system according to the present invention transfers a semiconductor device after uniformly preheating the semiconductor device in order to prevent deformation of the semiconductor device during the heat treatment process, rapidly performs the heat treatment process under the high temperature condition by heating the semiconductor device using a lamp heater and induction heat derived from induced electromotive force, and unloads the semiconductor device after uniformly cooling the semiconductor device such that the semiconductor device is prevented from being deformed when the heat treatment process has been finished.

In order to accomplish the above object, there is provided a heat treatment system for a semiconductor device, the heat treatment system comprising: a loading unit for conveying the semiconductor device and a support plate, on which the semiconductor device is rested, by preheating the semiconductor device and the support plate with a predetermined preheating temperature; a heating unit including at least two furnaces maintained with predetermined temperature levels, which are increased step by step up to a predetermined heat treatment temperature for the semiconductor device, the two furnaces being individually controlled, the semiconductor device conveyed to the heating unit from the loading unit being heated at the predetermined heat treatment temperature by the heating unit; a processing unit installed adjacent to the heating unit in order to heat the semiconductor device with a predetermined heat treatment temperature by using heat generated from a lamp heater and induction heating derived from induced electromotive force; a cooling unit including at least two furnaces maintained with predetermined temperature levels within a range between the predetermined heat treatment temperature and a predetermined cooling temperature, the two furnaces being individually controlled, the semiconductor device conveyed to the cooling unit from the processing unit being cooled at the predetermined cooling temperature by the cooling unit; and an unloading unit for discharging the semiconductor device, which has been cooled with the predetermined cooling temperature, after uniformly cooling the semiconductor device with a predetermined unloading temperature.

The loading unit includes a susceptor, which is formed at an upper center portion thereof with adiabatic or insulative slots (to be referred in this disclosure as "adiabatic slots") and on which the support plate is placed, a heating device for heating the susceptor, a lifting device for moving the susceptor up and down, and a horizontal conveyance device for horizontally moving the support plate. The susceptor is made from one selected from the group consisting of aluminum, aluminum alloys, graphite, aluminum oxide, aluminum nitride, and boron nitride. The susceptor has an area larger than an area of the support plate. The adiabatic slots have an area corresponding to 20 to 70% of an area of the support plate rested on an upper surface of the susceptor. A plurality of adiabatic slots are provided in a form of trenches, in which a width of the trench is identical to or smaller than an interval between the trenches. A width of a center portion of the trench is larger than widths of both side ends of the trench. The adiabatic slots have polygonal sectional shapes.

The heating device is accommodated in the susceptor or aligned at a lower portion of the susceptor. The heating device includes a resistance heater or a lamp heater. The lifting device includes a pneumatic cylinder, a ball screw unit or a timing belt installed at a lower portion of the susceptor. The horizontal conveyance device includes a roller and a motor for rotating the roller, the roller being accommodated in a roller recess formed at an upper surface of the susceptor with a predetermined length in order to convey the support plate making contact with an upper portion of the roller.

The processing unit includes an inner housing forming a heat treatment space for the semiconductor device, a lamp heater having a plurality of lamps installed at an inner upper portion or an inner lower portion of the inner housing, a first heat body having a single plate shape or consisting of a plurality of blocks and being installed in an area formed between the inner housing and the lamp heater corresponding to an installation area of the lamp heater, a magnetic core having a block shape and being installed at an outside of the inner housing corresponding to upper and lower portions of the inner housing, and an induction coil wound around the magnetic core.

The processing unit further includes a second heat body aligned in the inner housing in opposition to the first heat body about the semiconductor device. The processing unit further includes a roller installed at a lower portion of the inner housing in order to convey the semiconductor device and the support plate while supporting the semiconductor device and the support plate. The processing unit further includes an adiabatic plate having an area corresponding to an area of the inner housing and being installed between the inner housing and the magnetic core. The lamp heater includes a halogen lamp. The first and second heat bodies include silicon carbide or a carbon member coated with silicon carbide. The inner housing and the adiabatic or insulative plate (to be referred in this disclosure as "adiabatic plate") are made from quartz.

The induction coil is installed in an induction coil recess formed in the magnetic core while facing the inner housing. The magnetic core is spaced from the adiabatic plate by a predetermined distance and is cooled by means of cooling gas fed onto the magnetic core from an exterior. The magnetic core includes composite materials having including epoxy and ferrite powder or iron.

According to the present invention, the processing unit includes an inner housing forming a heat treatment space for the semiconductor device, a lamp heater installed at an inner upper portion and an inner lower portion of the inner housing, a heat body having a plate shape with an area corresponding to an installation area of the lamp heater and being installed at an inner upper portion and an inner lower portion of the lamp heater, a magnetic core having a block shape and being installed at an outside of the inner housing corresponding to upper and lower portions of the inner housing, and an induction coil wound around the magnetic core. At this time, the heat body includes silicon carbide or a carbon member coated with silicon carbide.

In addition, the unloading unit includes a gas spraying nozzle for spraying gas to the support plate and the semiconductor device with a predetermined spraying angle when the support plate and the semiconductor device are conveyed to the unloading unit from the cooling unit, a cooling susceptor, which is formed at a predetermined region thereof with spraying holes for spraying gas and on which the support plate is rested, a lifting device for moving the cooling susceptor up and down, and a horizontal conveyance device for horizontally conveying the support plate.

The heat treatment system of the present invention may further include a processing unit installed adjacent to the heating unit in order to heat the semiconductor device with a predetermined heat treatment temperature by using heat generated from a lamp heater and induction heating derived from induced electromotive force. In addition, the unloading unit may further include an upper heating device installed above the cooling susceptor in order to heat upper portions of the support plate and the semiconductor device. In this case, the cooling susceptor is made from one selected from the group consisting of aluminum, aluminum alloys, graphite, aluminum oxide, aluminum nitride, and boron nitride. The cooling susceptor has an area larger than an area of the support plate. The predetermined region of the cooling susceptor formed with the spraying holes has an area corresponding to at least 50% of an area of the support plate rested on an upper surface of the cooling susceptor. The spraying holes have circular sectional shapes or polygonal sectional shapes. The spraying hole has a diameter or a width in range of about 0.5 to 3 mm. An interval between the spraying holes is larger than a diameter or a width of the spraying hole. The gas spraying nozzle includes an upper nozzle and a lower nozzle, and the upper nozzle is spaced from the lower nozzle by a predetermined distance, which is larger than a total thickness of the semiconductor device and the support plate, in order to spray gas onto the upper and lower portions of the semiconductor device and the support plate. The gas spraying nozzle sprays gas while forming an obtuse angle with respect to a conveying direction of the support plate. At this time, a width of sprayed gas at least corresponds to a width of the support plate.

In addition, the lifting device includes a pneumatic cylinder, a ball screw unit or a timing belt installed at a lower portion of the cooling susceptor. The horizontal conveyance device includes a roller and a motor for rotating the roller, the roller being accommodated in a roller recess formed at an upper surface of the cooling susceptor with a predetermined length in order to convey the support plate making contact with an upper portion of the roller. An installation area of the upper heating device installed above the cooling susceptor is larger than an area of the support plate so that the upper heating device effectively heats upper portions of the semiconductor device and the support plate. The upper heating device includes a plurality of lamp heaters.

According to the present invention, the semiconductor device includes a glass substrate, an amorphous silicon thin film deposited on the glass substrate, and a poly-crystalline silicon thin film deposited on the glass substrate. The semiconductor device includes a thin film transistor used in a liquid crystal display or an organic light emitting display.

The heat treatment process includes one selected from the group consisting of a solid phase crystallization process for the amorphous silicon thin film, a metal induced crystallization process, a metal induced lateral crystallization process, an activation process for an ion-implanted poly-crystalline silicon thin film, and a pre-compaction process for the glass substrate. The heat treatment process is performed in a temperature range of about 400 to 1000° C.

The semiconductor device is conveyed while being rested on the support plate made from quartz having a thickness of about 3 to 10 mm. A width and a length of the support plate are larger than those of the semiconductor device by at least 10 mm. The support plate is formed with at least four vacuum holes, which are diagonally aligned in an installation area of the semiconductor device. The vacuum holes are aligned within 10 mm from lateral sides of the semiconductor device and have a circular shape having a diameter less than 3 mm or a rectangular shape having a width less than 3 mm.

According to another embodiment of the present invention, there is provided a heat treatment system for a semiconductor device which is conveyed while being rested on a support plate, the heat treatment system comprising: a loading unit for heating the semiconductor device and the support plate with a predetermined preheating temperature, wherein the loading unit includes a susceptor, which is formed at an upper center portion thereof with adiabatic slots and on which the support plate is placed, a heating device for heating the susceptor, a lifting device for moving the susceptor up and down, and a horizontal conveyance device for horizontally moving the support plate.

According to still another embodiment of the present invention, there is provided a heat treatment system for a semiconductor device which is conveyed while being rested on a support plate, the heat treatment system comprising: a processing unit for heating the semiconductor device with a predetermined heat treatment temperature, wherein the processing unit includes an inner housing forming a heat treatment space for the semiconductor device, a lamp heater formed at an inner upper portion or an inner lower portion of the inner housing, a first heat body having a plate shape and being installed in an area formed between the inner housing and the lamp heater corresponding to an installation area of the lamp heater, a magnetic core having a block shape and being installed at an outside of the inner housing corresponding to upper and lower portions of the inner housing, and an induction coil wound around the magnetic core. The processing unit further includes a second heat body aligned in the inner housing in opposition to the first heat body about the semiconductor device. The processing unit further includes a roller installed at a lower portion of the inner housing in order to convey the semiconductor device and the support plate while supporting the semiconductor device and the support plate. The processing unit further includes an adiabatic plate having an area corresponding to an area of the inner housing and being installed between the inner housing and the magnetic core.

According to still yet another embodiment of the present invention, there is provided a heat treatment system for a semiconductor device which is conveyed while being rested on a support plate, the heat treatment system comprising: an unloading unit for discharging the semiconductor device and the support plate, which have been heat-treated, after uniformly cooling the semiconductor device and the support plate with a predetermined unloading temperature, wherein the unloading unit includes a cooling susceptor, which is formed at a predetermined region thereof with spraying holes for spraying gas and on which the support plate is rested, a gas spraying nozzle installed at one side of the cooling susceptor in order to spray gas onto the support plate and the semiconductor device with a predetermined spraying angle when the support plate and the semiconductor device are conveyed into the unloading unit, a lifting device for moving the cooling susceptor up and down, and a horizontal conveyance device for horizontally conveying the support plate. The unloading unit further includes an upper heating device installed above the cooling susceptor in order to heat upper portions of the support plate and the semiconductor device.

EFFECT OF THE INVENTION

The heat treatment system for the semiconductor device according to the present invention can rapidly perform the heat treatment process for the semiconductor device by gradually increasing the temperature of the semiconductor device. In particular, the heat treatment system of the present invention can rapidly perform the heat treatment process, such as the crystallization process for the amorphous silicon thin film formed on the upper surface of the glass substrate, the dopant activation process for the TFT device consisting of the poly-crystalline silicon thin film, or the pre-compaction process for the glass substrate to form the silicon thin film on the upper surface of the glass substrate, while preventing the semiconductor device from being deformed. In addition, the heat treatment system of the present invention uniformly heats the semiconductor device while supporting the semiconductor device using the support plate, so the glass substrate can be prevented from being deformed or damaged.

According to the present invention, a contact area between the semiconductor device and the susceptor is relatively small in the center portion thereof so an amount of heat transferred to the center portion of the semiconductor device is less than an amount of heat transferred to the outer peripheral portion of the semiconductor device. Thus, the semiconductor device can be uniformly preheated over the whole area thereof so that deformation of the semiconductor device caused by the local temperature difference in the semiconductor device can be prevented.

In addition, according to the present invention, the processing unit applies heat to the semiconductor device by using heat generated from the lamp heater and induction heating derived from induced electromotive force, so that the heat treatment process for the semiconductor device can be performed under the higher temperature atmosphere while preventing the semiconductor device from being deformed.

According to the present invention, the unloading unit sprays cooling gas onto the semiconductor device being conveyed, thereby uniformly cooling the semiconductor device. Thus, heat treatment process for the semiconductor device can be rapidly performed while preventing the semiconductor device from being deformed or damaged.

In addition, according to the present invention, the unloading unit applies heat to the upper portion of the semiconductor device by means of a heating device while spraying gas onto the lower surface of the support plate supporting the semiconductor device, so that the semiconductor device and the support plate can be uniformly cooled while preventing the deformation of the semiconductor device caused by the local temperature difference in the semiconductor device.

BRIEF DESCRIPTION OF THE DRAWINGS

The foregoing and other objects, features and advantages of the present invention will become more apparent from the following detailed description when taken in conjunction with the accompanying drawings in which:

FIG. 3b is a sectional view taken along line A-A shown in FIG. 3a;

FIG. 6b is a sectional perspective view of a connection part of the heating furnace shown in FIG. 6a;

FIG. 14b is a side view of FIG. 14a;

FIG. 15b is a sectional view taken along line A-A shown in FIG. 15a;

BEST MODE FOR CARRYING OUT THE INVENTION

Hereinafter, preferred embodiments of the present invention will be described with reference to accompanying drawings.

Figure 1:
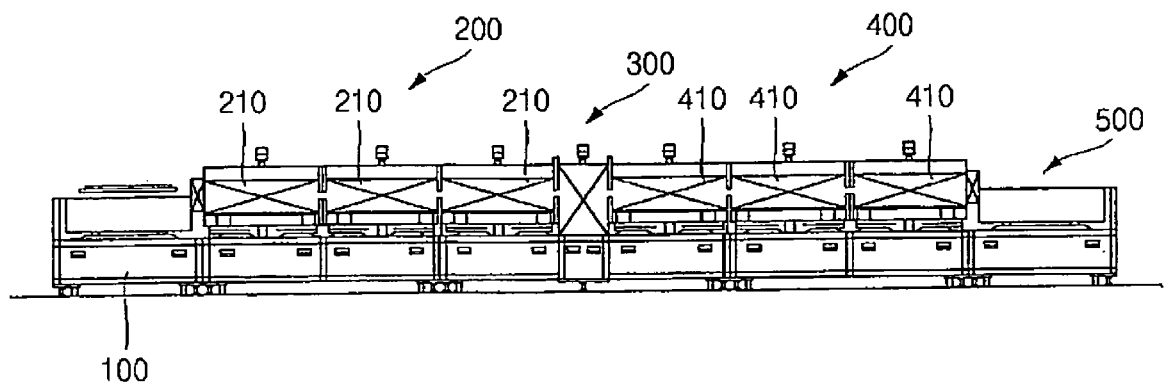
FIG. 1 is a view illustrating a structure of a heat treatment system for semiconductor devices according to one embodiment of the present invention.

FIG. 1 is a view illustrating a structure of a heat treatment system for semiconductor devices according to one embodiment of the present invention.

As shown in FIG. 1, the heat treatment system for semiconductor devices according to the present invention includes a loading unit 100, a heating unit 200, a processing unit 300, a cooling unit 400 and an unloading unit 500, which are sequentially installed adjacent to each other in such a manner that external air is prevented from penetrating into a heat treatment space formed in the heating unit 200, the processing unit 300 and the cooling unit 400. The above units of the heat treatment system have temperature control modules and horizontal conveyance devices, respectively, so that each unit can individually increase or decrease the heat treatment temperature while the heat treatment process is being carried out. In addition, the heat treatment system for semiconductor devices according to the present invention transfers the semiconductor devices by mounting the semiconductor devices on a separate setter thereby preventing the semiconductor devices from being deformed during the heat treatment process. Therefore, the heat treatment system for semiconductor devices according to the present invention can rapidly perform the heat treatment process for the semiconductor device while gradually increasing or decreasing the temperature of the semiconductor device, thereby preventing the semiconductor device from being deformed or damaged. In addition, since the heat treatment system can rapidly perform the heat treatment process without deforming the semiconductor devices, the semiconductor device including a glass substrate can be heat-treated at a higher temperature atmosphere, that is, at a temperature above 600° C. The semiconductor devices, which are heat-treated by means of the heat treatment system according to the present invention, refer to various semiconductor devices to be heat-treated, such as glass substrates formed at upper surfaces thereof with amorphous silicon thin films or glass substrates having poly-crystalline TFTs. In addition, the semiconductor device includes a glass substrate requiring a pre-compaction process for forming a semiconductor thin film thereon. In the following description, the term "semiconductor device" refers to a glass substrate formed at an upper surface thereof with an amorphous silicon thin film.

First, the description will be made in relation to the structure of the heat treatment system for the semiconductor device according to one embodiment of the present invention.

The loading unit 100 preheats the semiconductor device and conveys the preheated semiconductor device to the heating unit 200. At this time, the loading unit 100 preheats the semiconductor device, that is, the glass substrate having the amorphous silicon thin film with a predetermined preheating temperature (for example, 200° C.) while supporting the glass substrate such that the glass substrate is prevented from being deformed. The loading unit 100 can be individually used for other heat treatment systems having structures different from the structure of the heat treatment system according to the present invention.

The heating unit 200 heats the semiconductor device with a predetermined heating temperature and conveys the heated semiconductor device into the processing unit 300. The heating unit 200 includes at least two furnaces 210, the temperature of which can be individually controlled. The number of furnaces 210 may be determined by taking the heat treatment temperature into consideration. That is, the temperature of furnaces 210 of the heating unit 200 is individually controlled according to the steps of the heat treatment process. Preferably, a temperature of a last furnace equals to the heat treatment temperature in such a manner that the semiconductor device can be partially heat-treated in the heating unit 200. For instance, if the heat treatment temperature for the semiconductor device is 600° C., the heating unit 200 preferably consists of three furnaces 210, in which a first furnace connected to the loading unit 100 is maintained with the temperature above 300° C. by taking the preheating temperature of the loading unit 100 into consideration, and second and third furnaces are maintained with the temperature above 600° C., which corresponds to the heat treatment temperature. That is, in a lower temperature atmosphere, the semiconductor device can be prevented from being deformed even if the heating temperature thereof is rapidly increased. However, in a higher temperature atmosphere, the semiconductor device may be deformed if the heating temperature thereof is rapidly increased. Thus, it is preferred to gradually increase the heating temperature for the semiconductor device in the higher temperature atmosphere. For this reason, the furnaces of the heating unit 200 are rapidly heated in the lower temperature atmosphere and slowly heated in the higher temperature atmosphere.

Upon receiving the semiconductor device from the heating unit 200, the processing unit 300 processes the semiconductor device with a predetermined heat treatment temperature and conveys the semiconductor device into the cooling unit 400 maintained with a predetermined temperature. The processing unit 300 is installed adjacent to the heating unit 200 and instantly heats the semiconductor device with a high temperature by using a lamp heater including a halogen lamp and induction heat derived from induced electromotive force. That is, the processing unit 300 instantly heats the semiconductor device with the high temperature while preventing the semiconductor device from being deformed. To this end, the processing unit 300 includes a magnetic core for generating electromotive force and an induction coil. If the heat treatment system of the present invention is used for the pre-compaction process of the glass substrate, the processing unit 300 can be omitted from the heat treatment system. That is, since the pre-compaction process is carried out under the relatively low temperature atmosphere, the processing unit 300 having the high temperature is not necessary. However, since the processing unit 300 can be maintained with a temperature adaptable for the pre-compaction process, it is also possible to provide the processing unit 300 in the heat treatment system according to the present invention when performing the pre-compaction process for the glass substrate. In addition, the processing unit 300 can be individually used for other heat treatment systems having structures different from the structure of the heat treatment system according to the present invention.

Similarly to the heating unit 200, the cooling unit 400 includes at least two furnaces 410, the temperature of which can be individually controlled. The number of furnaces 410 may be determined by taking the heat treatment temperature into consideration. For instance, if the heat treatment temperature is 600° C., the cooling unit 400 preferably consists of tree furnaces 410, in which a first furnace connected to the processing unit 300 is maintained with a temperature identical to the heat treatment temperature of the processing unit 300, a second furnace is maintained with a temperature of about 500° C., and a third furnace is maintained with a temperature below 300° C. by taking an unloading temperature of the semiconductor device into consideration. Thus, the cooling unit 400 can rapidly cool the semiconductor device within a short period of time. After cooling the semiconductor device, the cooling unit 400 conveys the semiconductor device into the unloading unit 500.

Upon receiving the semiconductor device from the cooling unit 400, the unloading unit 500 uniformly cools the semiconductor device with a predetermined unloading temperature (in general, below 100° C.) while preventing the semiconductor device from being deformed and conveys the semiconductor device to the next processing stage. Thus, the cooling unit 400 may include various cooling devices capable of uniformly cooling the semiconductor device. In addition, the unloading unit 500 may have a heating device for heating an upper surface of the semiconductor device such that the semiconductor device can be uniformly cooled. The unloading unit 500 can be individually used for other heat treatment systems having structures different from the structure of the heat treatment system according to the present invention.

The loading unit 100, the heating unit 200, the processing unit 300, the cooling unit 400 and the unloading unit 500 are sequentially positioned so as to preform the heat treatment process with respect to the semiconductor device moving along the above units 100 to 500. Preferably, connection parts provided between the heating unit 200 and the processing unit 300 and between the processing unit 300 and the cooling unit 400 may be sealed in such a manner that external air is prevented from penetrating into the heat treatment space.

Hereinafter, the description will be made in relation to components of the heat treatment system for the semiconductor device according to the present invention.

Figure 2:
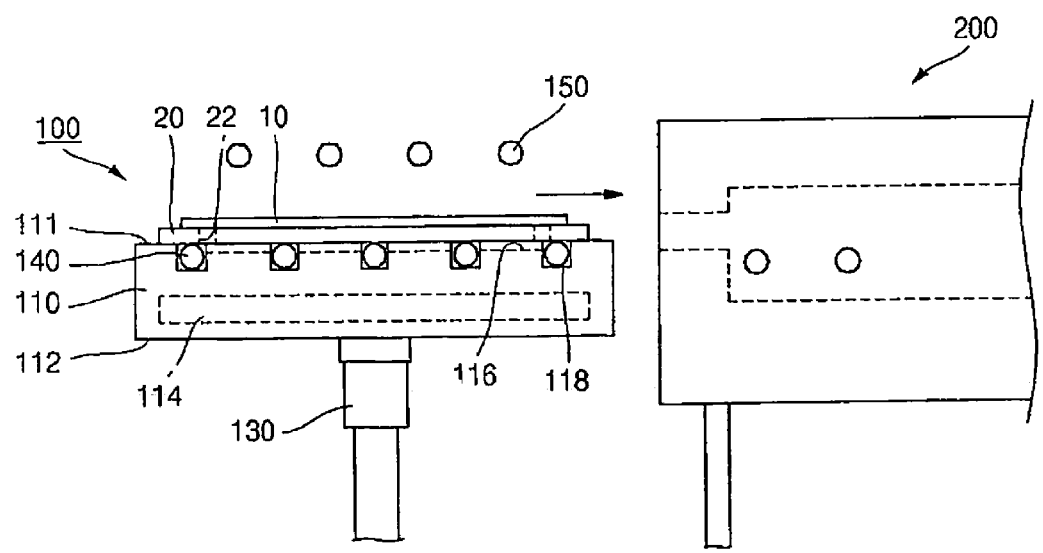
FIG. 2 is a front view of a loading unit of a heat treatment system for semiconductor devices according to one embodiment of the present invention.
Figure 3A:
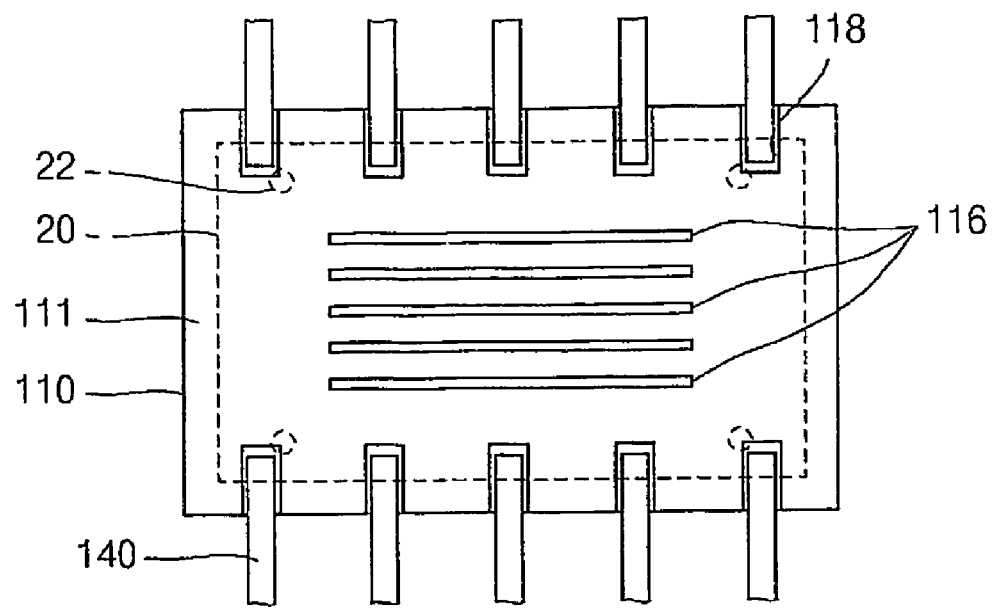
FIG. 3a is a plan view of a susceptor, which is a part of a loading section according to one embodiment of the present invention.
Figure 3B:
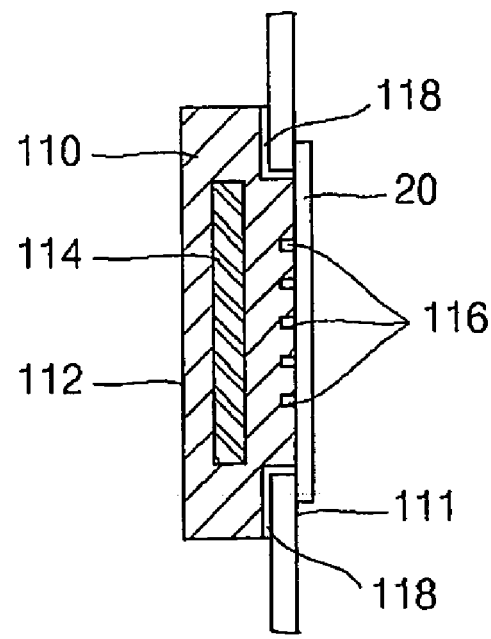

FIG. 2 is a front view of the loading unit of the heat treatment system for the semiconductor device according to one embodiment of the present invention, FIG. 3a is a plan view of a susceptor, which is a part of the loading section according to one embodiment of the present invention, and FIG. 3b is a sectional view taken along line A-A shown in FIG. 3a.

Referring to FIG. 2, the loading unit 100 includes a susceptor 110 on which the semiconductor device 10 and a support plate 20 are rested and preheated, a lifting device 130 for moving the susceptor 110 up and down, and a horizontal conveyance device 140 for conveying the a support plate 20 in the left or right direction. In addition, the loading unit 100 may further include an auxiliary preheating device 150 installed at an upper portion of the susceptor 110 for additionally preheating the semiconductor device 10. The loading unit 100 conveys the semiconductor device 10 to the heating unit 200 maintained with a high temperature after preheating the semiconductor device 10 with a predetermined temperature in order to prevent the semiconductor device 10 from being deformed or damaged due to sudden temperature variation and a local temperature difference thereof. As shown in FIG. 2, the loading unit 100 preheats the semiconductor device when the semiconductor device is in a waiting state. However, if necessary, a separate case (not shown) can be provided in the loading unit 100 in order to shield the susceptor 110 from an exterior. In this case, specific gas can be fed into the case in order to form a preheating atmosphere.

The support plate 20 is preferably made from quartz having a thickness of about 3 to 10 mm and conveys the semiconductor device 10, which is placed on the support plate 20, during the heat treatment process. If the thickness of the support plate 20 is smaller than 3 mm, the support plate 20 may be deformed during the heat treatment process. In contrast, if the thickness of the support plate 20 is larger than 10 mm, relatively long heating time is necessary, thereby degrading the heat treatment efficiency of the semiconductor device. In addition, since the support plate 20 heats the semiconductor device 10 while supporting the semiconductor device 10, the support plate 20 must have a length and a width larger than those of the semiconductor device 10 in order to uniformly preheat the semiconductor device 10. Preferably, the support plate 20 has a size larger than that of the semiconductor device 10 by at least 10 mm. Although the support plate 20 is preferably made from quartz, the present invention is not limited thereto. For instance, the support plate 20 can be fabricated by using ceramic materials including alumina nitride or boron nitride.

The support plate 20 is formed with vacuum holes 22 for attaching/detaching the semiconductor device 10 to/from the support plate 20. Preferably, at least four vacuum holes 22 are formed in the support plate 20 diagonal to each other within a predetermined area of the support plate 20 in which the semiconductor device 10 is placed. The vacuum holes 22 can be formed at each edge and centers of lateral sides of the predetermined area of the support plate 20 corresponding to the semiconductor device 10. The vacuum hole 22 has a circular shape having a diameter less than 3 mm or a rectangular shape having a width less than 3 mm. Preferably, the vacuum holes 2 are aligned within 10 mm from lateral sides of the semiconductor device 10. If the vacuum holes 2 are aligned out of the above range, temperature distribution of the semiconductor device 10 is uneven in the vicinity of the vacuum holes 22, causing deformation of the glass substrate of the semiconductor device 10. In addition, if the size of the vacuum hole 22 is larger than 3 mm, the glass substrate of the semiconductor device 10 may locally droop during the heat treatment process.

Referring to FIGS. 3a and 3b, the susceptor 110 has a substantially horizontal plate shape having a size larger than that of the support plate 20 placed on an upper surface 111 of the susceptor 110. The susceptor 110 includes a heating device 114 for heating the susceptor 110 and adiabatic slots 116 allowing the support plate 20 to be uniformly heated. The susceptor 110 has a height corresponding to an inlet of the heating unit. In addition, the susceptor 110 can include roller recesses 118 for receiving rollers of the horizontal conveyance device therein. The susceptor 110 is made from a material having superior thermal conductivity so that the susceptor 110 can effectively transfer heat from the heating unit to the support plate 20. For instance, the susceptor 110 is made from one selected from the group consisting of aluminum, aluminum alloys, graphite, aluminum oxide, aluminum nitride, and boron nitride. However, the present invention is not limited to the above materials. Although the support plate 20 is placed on the susceptor 110, the support plate 20 is shown in dotted lines in FIG. 3b for illustrative purposes only. In addition, the vacuum holes 22 formed at edge portions of the support plate 20 are also shown in dotted lines.

The heating device 114 includes a heating member, such as a heating wire or a lamp. Preferably, the heating device 114 is accommodated in the susceptor 110 in order to uniformly increase the temperature of the upper surface 111 of the susceptor 110. That is, a plurality of heating members can be is installed in the susceptor 110 while forming a predetermined interval therebetween. At this time, the heating device 114 can be integrally formed with the susceptor 110 or installed in a hole formed in the susceptor 110. In addition, the heating device 114 can be installed at a lower surface 112 of the susceptor 110. Preferably, the heating device 114 has capacity sufficient for heating the susceptor 110 at the temperature above 200° C.

The adiabatic slots 116 are aligned at a center area of the upper surface 11 of the susceptor 110 in a predetermined pattern. The adiabatic slots 116 may reduce a contact area between the susceptor 110 and the support plate 20, thereby adjusting an amount of heat transferred to the center area of the support plate 20 from the susceptor 110. That is, the temperature of heat transferred to the center area of the support plate 20 making contact with the adiabatic slots 116 is different the temperature of heat transferred to a peripheral area of the support plate 20, which does not make contact with the adiabatic slots 116, so the temperature is uniformly increased over the whole area of the support plate 20 rested on the upper surface 111 of the susceptor 110. In detail, the upper surface 111 of the susceptor 110 is uniformly heated by means of the heating device 114 and the support plate 20 physically makes contact with the upper surface 111 of the susceptor 110 so that the support plate 20 is preheated by means of heat transferred thereto from the susceptor 110. However, since the support plate 20 is totally exposed to the exterior when it is preheated, heat transferred to the support plate 20 is partially emitted to the exterior. Accordingly, the temperature difference may occur between the center area and the peripheral area of the support plate 20 due to the heat emitted to the exterior. That is, the temperature of the center area is higher than that of the peripheral area. In this case, the semiconductor device 10 rested on the upper surface of the support plate 20 also represents the temperature difference between the center area and the peripheral area thereof according to the temperature difference of the support plate 20, so the semiconductor device 10 may be deformed. However, if the adiabatic slots 116 are formed in the center area of the upper surface 111 of the susceptor 110, the temperature of heat transferred to the center area of the support plate 20 making contact with the center area of the susceptor 110 is lower than the temperature of heat transferred to the peripheral area of the support plate 20. Accordingly, although the heat transferred to the peripheral area of the support plate 20 is partially emitted to the exterior, the temperature of the peripheral area of the support plate 20 is substantially identical to the temperature of the center area of the support plate 20, so that the support plate 20 is uniformly heated.

The adiabatic slots 116 can be formed on the center area of the susceptor 110 with various sizes and shapes by taking the sizes of the support plate 20 and the semiconductor device 10 and preheating temperatures thereof into consideration. As shown in FIGS. 3a and 3b, the adiabatic slots 116 can be provided in the center area of the upper surface 111 of the susceptor 110 in the form of trenches, which extend in the vertical direction or the horizontal direction with predetermined widths and depths. In addition, the adiabatic slots 116 in the form of trenches are spaced from each other by a predetermined interval. Preferably, the center area of the susceptor 110 formed with the adiabatic slots 116 corresponds to 20 to 70% of the total area of the support plate 20 rested on the upper surface of the susceptor 110, more preferably, corresponds to 20 to 50% of the total area of the support plate 20. If the center area of the susceptor 110 formed with the adiabatic slots 116 is smaller than 20% of the total area of the support plate 20, heat transferred to the center area of the support plate 20 is not sufficiently shielded. In this case, the temperature of the center area of the support plate 20 may significantly rise, so that it is difficult to uniformly preheat the support plate 20. In contrast, if the center area of the susceptor 110 formed with the adiabatic slots 116 is larger than 70% of the total area of the support plate 20, heat transferred to the peripheral area of the support plate 20 is partially shielded. In this case, the temperature of heat transferred to the peripheral area of the support plate 20 becomes decreased, so that it is difficult to uniformly preheat the support plate 20.

In addition, if the preheating temperature applied to the support plate 20 and the semiconductor device 10 is relatively low, that is, if the difference between the normal temperature and the preheating temperature becomes reduced, an amount of heat emitted from the lateral sides of the support plate 20 is also relatively reduced. Accordingly, it is possible to uniformly preheat the support plate 20 even if the adiabatic slots 116 are formed in a relatively small area.

In addition, when the adiabatic slots 116 are formed as trenches, the width of the trench and the interval between trenches must be properly adjusted. If the width of the trench is too large, the heat is unevenly transferred to the center area of the support plate 20, so the temperature difference may occur within the center area of the support plate 20. In this case, the temperature difference may also occur in the center area of the semiconductor device rested on the upper surface of the support plate 20, so that the semiconductor device may be deformed or damaged. Therefore, it is preferred to reduce the width of the trench while increasing the number of the trenches. In addition, it is preferred if the width of the trench is identical to or smaller than the interval between trenches. More preferably, the width of the trench corresponds to a half of the interval between trenches. If the width of the trench is larger than the interval between trenches, heat transferred to the support plate 20 may be excessively shielded, so that the temperature of the center area of the support plate 20 making contact with the adiabatic slots 116 may be lower than the temperature of the peripheral area of the support plate 20. For instance, the width of the trench is preferably 1 to 3 mm and the interval between the trenches is preferably 3 to 6 mm.

In addition, the adiabatic slots 116 have predetermined depths in such a manner that the support plate 20 does not directly make contact with the susceptor 110. However, if the depth of the adiabatic slot 116 is excessive, the heating device 114 accommodated in the susceptor 110 may become distant from the upper surface of the susceptor 110. Thus, it is necessary to properly adjust the depth of the adiabatic slot 116.

The roller recesses 118 are formed at front and rear sides of the susceptor 110 with a predetermined interval. The roller recesses 118 have predetermined lengths so that front and rear portions of the support plate 20 rested on the upper surface of the susceptor 110 may partially make contact with the roller recesses 118. In addition, the roller recesses 118 have predetermined depths to prevent rollers accommodated in the roller recesses 118 from protruding out of the roller recesses 118 when the susceptor 110 moves upwards in order to preheat the support plate 20 while supporting the support plate 20. Accordingly, in the preheating process, the support plate 20 uniformly makes contact with the upper surface 111 of the susceptor 110. When the preheating process has been completed, the susceptor 110 is moved down and conveyed in the left or right direction by means of the rollers 140 accommodated in the roller recesses 118. The roller recesses 118 are selectively formed only when the horizontal conveyance device 140, which is used for conveying the support plate 20 in the left or right direction, includes the rollers.

Referring to FIG. 2, the lifting device 130 is coupled to the lower surface 112 of the susceptor 110 in order to move the susceptor 110 up and down. The susceptor 110 moves upwards by means of the lifting device 130 while supporting the support plate 20 in order to preheat the support plate 20. After the preheating process has been completed, the susceptor 110 is again moved down so that the support plate 20 supported by means of the rollers. The lifting device 130 includes a pneumatic cylinder, a ball screw unit or a timing belt. Preferably, the pneumatic cylinder is used as the lifting device 130. However, the present invention does not limit the kind of the lifting devices, if they can move the susceptor 110 up and down. In addition, at least two lifting devices 130 can be provided by taking the weight and the area of the susceptor 110 into consideration.

The horizontal conveyance device 140 transfers the support plate 20 into the heating unit 200 by horizontally conveying the support plate 20. Preferably, the horizontal conveyance device 140 includes rollers rotatably accommodated in the roller recesses 118 of the susceptor 110. The rollers 140 are aligned with a predetermined interval by taking the size of the support plate 20 into consideration. The rollers 140 are rotatably supported by means of a separate supporting unit (not shown) and rotated by means of a separate driving unit (not shown). Therefore, a plurality of rollers 140 are horizontally disposed while forming the predetermined interval therebetween and are rotated in order to horizontally convey the support plate 20 rested on the rollers 140.

Besides the rollers, a pneumatic cylinder or a ball screw unit can be used as the horizontal conveyance device 140. The present invention does not limit the kind of the horizontal conveyance devices. For instance, if the pneumatic cylinder is used as the horizontal conveyance device 140, as shown in FIG. 2, the pneumatic cylinder is installed at an outer portion of the susceptor 110 while being supported by means of the separated supporting unit in order to horizontally convey the support plate 20 from the left side to the right side. In this case, it is not necessary to form the roller recesses 118 in the upper surface of the susceptor 110.

Figure 4:
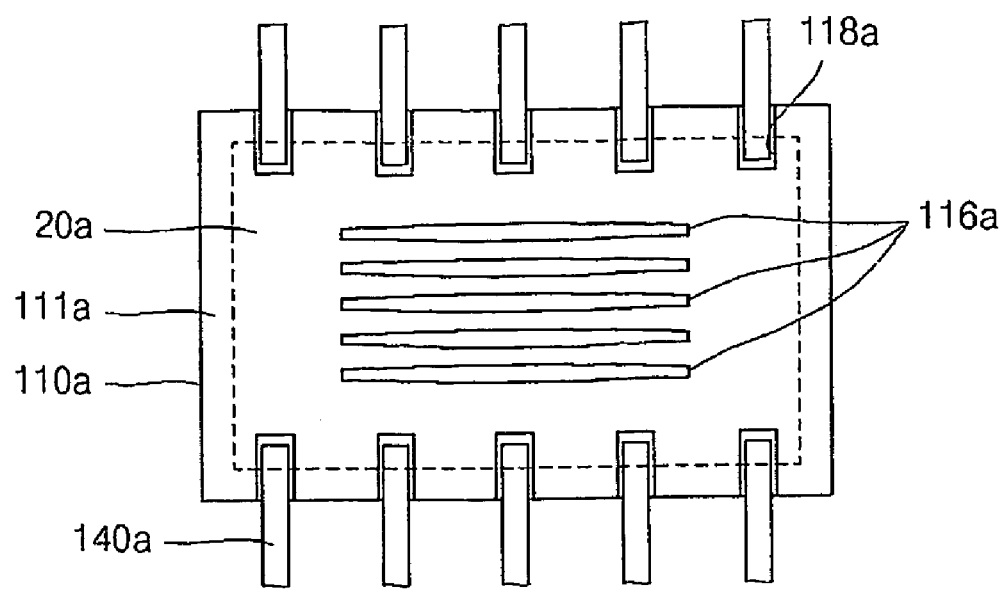
FIG. 4 is a plan view of a susceptor according to another embodiment of the present invention.

FIG. 4 is a plan view illustrating a susceptor 110a according to another embodiment of the present invention.

Referring to FIG. 4, the susceptor 110a according to another embodiment of the present invention is formed at an upper surface thereof with adiabatic slots 116a in the form of trenches, wherein a center portion of the trench has a width larger than widths of both end portions thereof. Accordingly, when the support plate 20a is rested on the upper surface of the susceptor 110a, the temperature difference may occur within the center area of the support plate 20a making contact with the adiabatic slots 116a, so the support plate 20a can be uniformly preheated. Preferably, center portions of outermost adiabatic slots 116a have widths identical to those of both end portions thereof.

Figure 5:
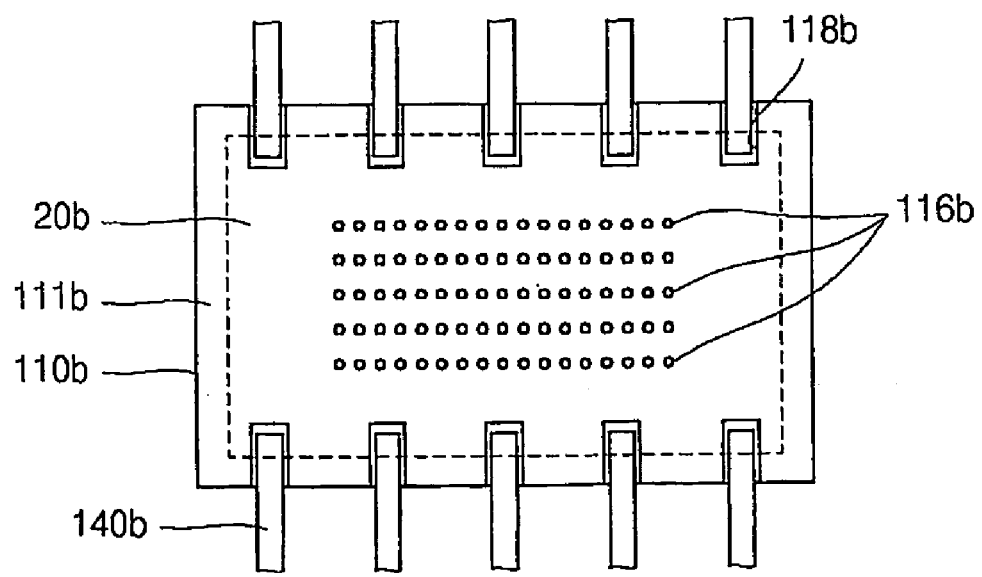
FIG. 5 is a plan view of a susceptor according to still another embodiment of the present invention.

FIG. 5 is a plan view of a susceptor 10b according to still another embodiment of the present invention.

Referring to FIG. 5, the susceptor 110b according to still another embodiment of the present invention is formed at an upper surface thereof with a plurality of adiabatic holes 116b having circular shapes. The present invention does not limit the shapes of the adiabatic holes 116b. For instance, the adiabatic holes 116b can be formed with rectangular shapes, triangular shapes or polygonal shapes. In addition, the adiabatic holes 116b can be aligned in a radial pattern in such a manner that diameters of the adiabatic holes 116b are gradually reduced about a central adiabatic hole. In this case, a contact area between the susceptor 110b and a support plate 20b can be adjusted while incurring the temperature difference within the center area of the support plate 20b making contact with the adiabatic holes 116b, so that the support plate 20 can be uniformly preheated.

Referring again to FIG. 1, the heating unit 200 includes at least two furnaces 210. The number of furnaces 210 is properly selected by taking the heat treatment temperature into consideration. The temperature of the furnaces 210 of the heating unit 200 can be individually controlled according to the steps of the heat treatment process. Preferably, the temperature of a last furnace of the heating unit 200 equals to the heat treatment temperature in such a manner that the semiconductor device can be partially heat-treated in the heating unit 200.

Figure 6A:
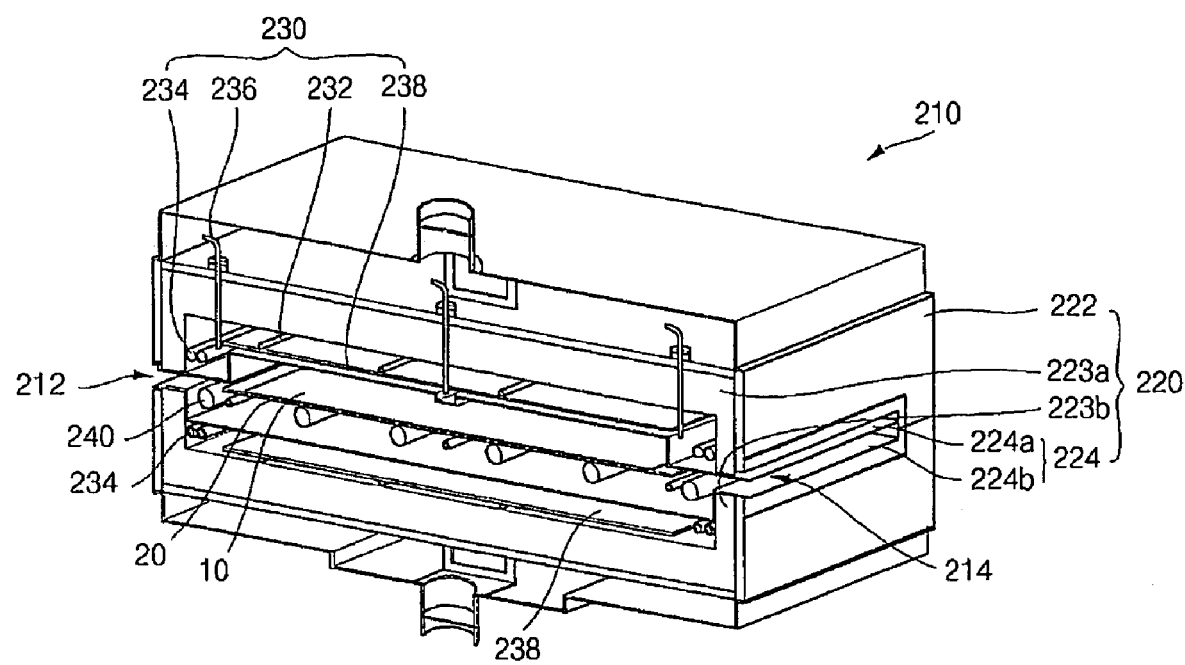
FIG. 6a is a sectional perspective view of a heating furnace forming a heating unit.
Figure 6B:
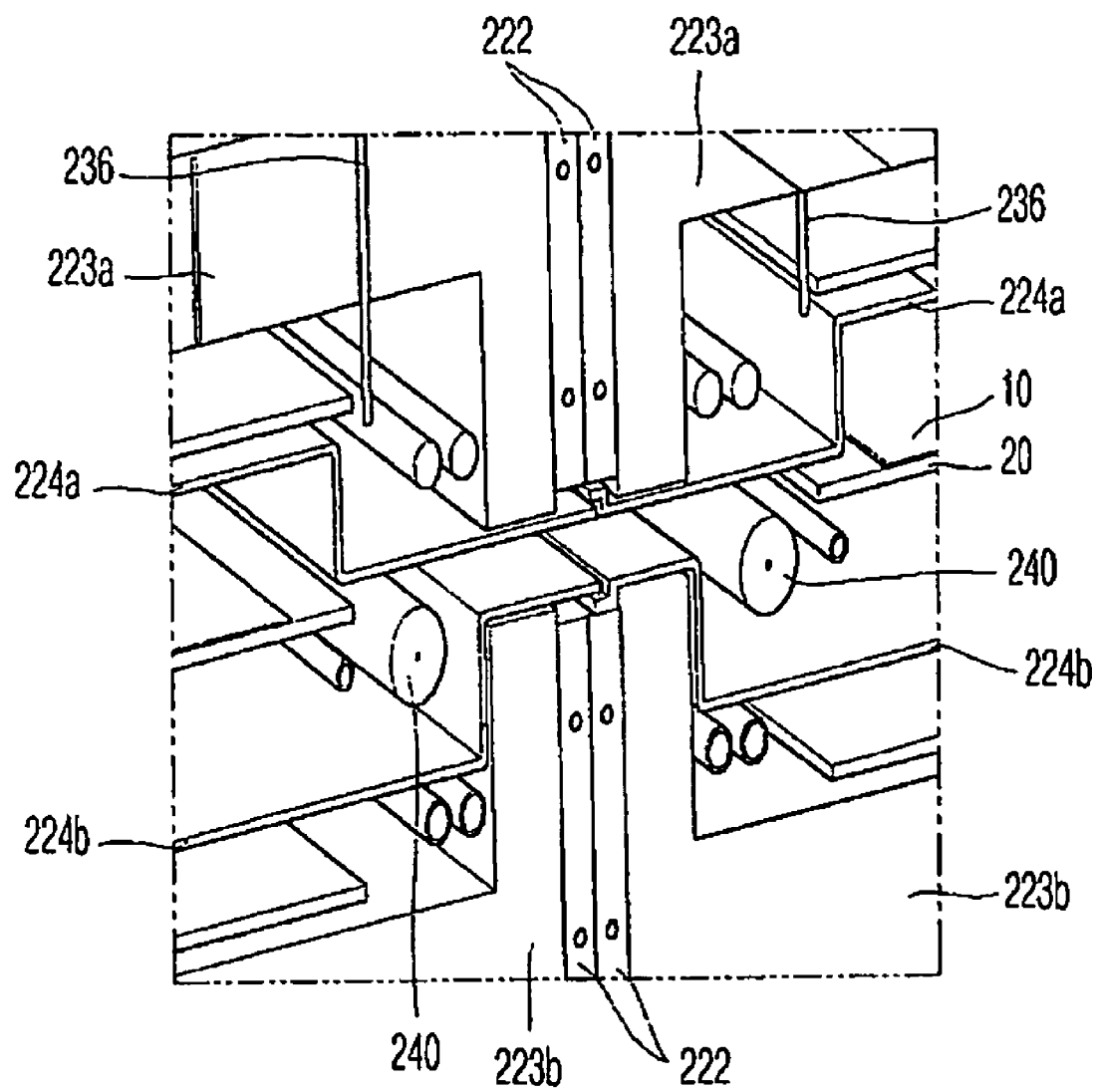

FIG. 6a is a sectional perspective view of the heating furnace forming the heating unit, and FIG. 6b is a sectional perspective view of a connection part of the heating furnace shown in FIG. 6a.

Referring to FIG. 6a, the heating furnace 210 includes a body section 220, a heating device 230 accommodated in the body section 220 in order to generate heat, and rollers 240 for horizontally conveying the semiconductor device 10 and the support plate 20. The heating furnace 210 is formed at one end thereof with an inlet section 212 for loading the support plate 20 and the semiconductor device 10 into the heating furnace 210. In addition, the heating furnace 210 is formed at the other end thereof with an outlet section 214 for unloading or discharging the support plate 20 and the semiconductor device 10 from the heating furnace 210. The furnace 210 can be provided at an inner portion thereof with a position sensor (not shown) for detecting a heating position of the support plate 20. In addition, a gas feeding unit (not shown) can be installed in the furnace 210 in order to constantly feed inert gas, such as nitride gas. The internal portion of the furnace 210 can be maintained under the positive pressure atmosphere due to the gas fed into the furnace 210. In addition, external air is prevented from penetrating into the furnace 210 so that the internal temperature of the furnace 210 can be uniformly maintained. Preferably, the gas feeding unit feeds gas into the furnace 210 through an upper portion of the furnace 210. The gas fed into the furnace 210 is discharged to an exterior through a lower portion of the furnace 210.

The body section 220 includes an outer housing 222 forming an external appearance of the furnace 210, adiabatic members 223a and 223b installed in the outer housing 222 while being longitudinally spaced from each other by a predetermined distance, and inner housings 224a and 224b aligned between the adiabatic members 223a and 223b in order to form a heat treatment space therebetween. Preferably, the inner housings 224a and 224b are made from quartz so as to prevent the heat treatment space from being contaminated.

The heating device 230 includes first heating members 232 and thermocouples 236. In addition, the heating device 230 may further include a second heating member 234 installed at upper and lower portions of the inlet and outlet sections 212 and 214 of the furnace 210. Also, the heating device 230 includes a conductive plate 238 installed between the inner housings 224a and 224b and the first heating members 232 closely to the inner housings 224a and 224b.

The first heating members 232 are installed between the inner housings 224a and 224b and the adiabatic members 232a and 232b with a predetermined interval in order to apply heat to the heat treatment space at a predetermined temperature. Although FIG. 6a shows that the heating members 232 are installed at the upper portion of the heating furnace 210, the heating members 232 can also be installed at the lower portion of the heating furnace 210. The number of the heating members 232 can be properly selected according to the temperature of the furnace 210. It is preferred to individually align a plurality of heating members 232, rather than packaging the heating members 232 in one module, such that each of the heating members 232 can be individually controlled. Preferably, the heating members 232 are installed in predetermined regions of the furnace 210, which are divided about a horizontal plane of the furnace. For instance, the furnace 210 is divided into nine regions and the heating members 232 are installed in the nine regions in order to control internal temperature of the furnace 210. Since the temperature difference may occur between the predetermined regions formed in the internal portion of the heating furnace 210, the heating members 232 installed in the predetermined regions are individually controlled, thereby compensating for the temperature difference between the predetermined regions. A resistance heater or a lamp heater is used as the heating member 232. However, the present invention does not limit the kind of the heating members 232.

The second heating member 234 is installed at the upper and lower portions of the inlet and outlet sections 212 and 214 of the furnace 210 in order to prevent the temperature of the inlet and outlet sections 212 and 214 of the furnace 210 from being decreased lower than the internal temperature of the furnace. That is, since heat of the inlet and outlet sections 212 and 214 of the furnace 210 can be emitted to the exterior, the inlet and outlet sections 212 and 214 of the furnace 210 may have the relatively low temperature. Thus, the second heating member 234 is installed at the inlet and outlet sections 212 and 214 of the furnace 210, so that the inlet and outlet sections 212 and 214 of the furnace 210 having the temperature identical to the internal temperature of the furnace 210.

The thermocouples 236 are positioned adjacent to the inner housing 224a in order to measure the temperature of the furnace. The heating members 232 are controlled based on the measurement result of the thermocouples 236. When the heating members 242 are individually installed in each region of the furnace 210, the thermocouples are also installed in each region of the furnace 210 corresponding to the heating members 242. In addition, the thermocouples 236 are installed in the heat treatment space in order to precisely measure the temperature in the heat treatment space.

The conductive plate 238 is provided between the heating members 232 and the inner housings 224a and 224b and has an area corresponding to a horizontal area of the heat treatment space in order to uniformly transfer heat of the heating members 232 to the inner housings 224a and 224b. That is, since the heating members 232 are aligned while forming a predetermined interval therebetween, the local temperature difference may occur in the inner housings 224a and 224b and in the heat treatment space formed between the inner housings 224a and 224b. Thus, the conductive plate 238 has the role of uniformly transferring heat of the heating members 232 to the inner housings 224a and 224b. The conductive plate 238 is made from metals having superior thermal conductivity or ceramic materials. For instance, the conductive plate 238 is made from stainless steel, copper, aluminum or alumina.

The rollers 240 have cylindrical shapes and are aligned at inner potions of the inner housings 224a and 224b of the furnace 210. The rollers 240 are spaced from each other by a predetermined distance corresponding to the sizes of the furnace 210 and the support plate 20 to be conveyed. The rollers 240 are installed vertically to the conveying direction of the support plate 20 or the inlet and outlet sections 212 and 214. In addition, the rollers 240 extend out of the outer housing 222 and are rotated by means of a separate rotating unit (not shown). The rollers 240 are accommodated in the inner housings 224a and 224b with a predetermined height. Preferably, the rollers 240 are positioned higher than bottom surfaces of the inlet and outlet sections 212 and 214 of the furnace 210, so that the lower surface of the support plate 20 being conveyed by the rollers 240 do not make contact with the bottom surfaces of the inlet and outlet sections 212 and 214 of the furnace 210. In addition, the rollers 240 are preferably made from quartz, which is used for fabricating the inner housings 224a and 224b, so generation of contaminated materials caused by friction may be minimized when conveying the support plate 20.

Referring to FIG. 6b, the heating unit 200 allows the inner housings 224a and 224b to be coupled with each other when the furnace 210 is connected to the heating unit 200, thereby preventing external air from penetrating into the furnace 210 while preventing air in the furnace 210 from being exhausted to the exterior.

Figure 7:
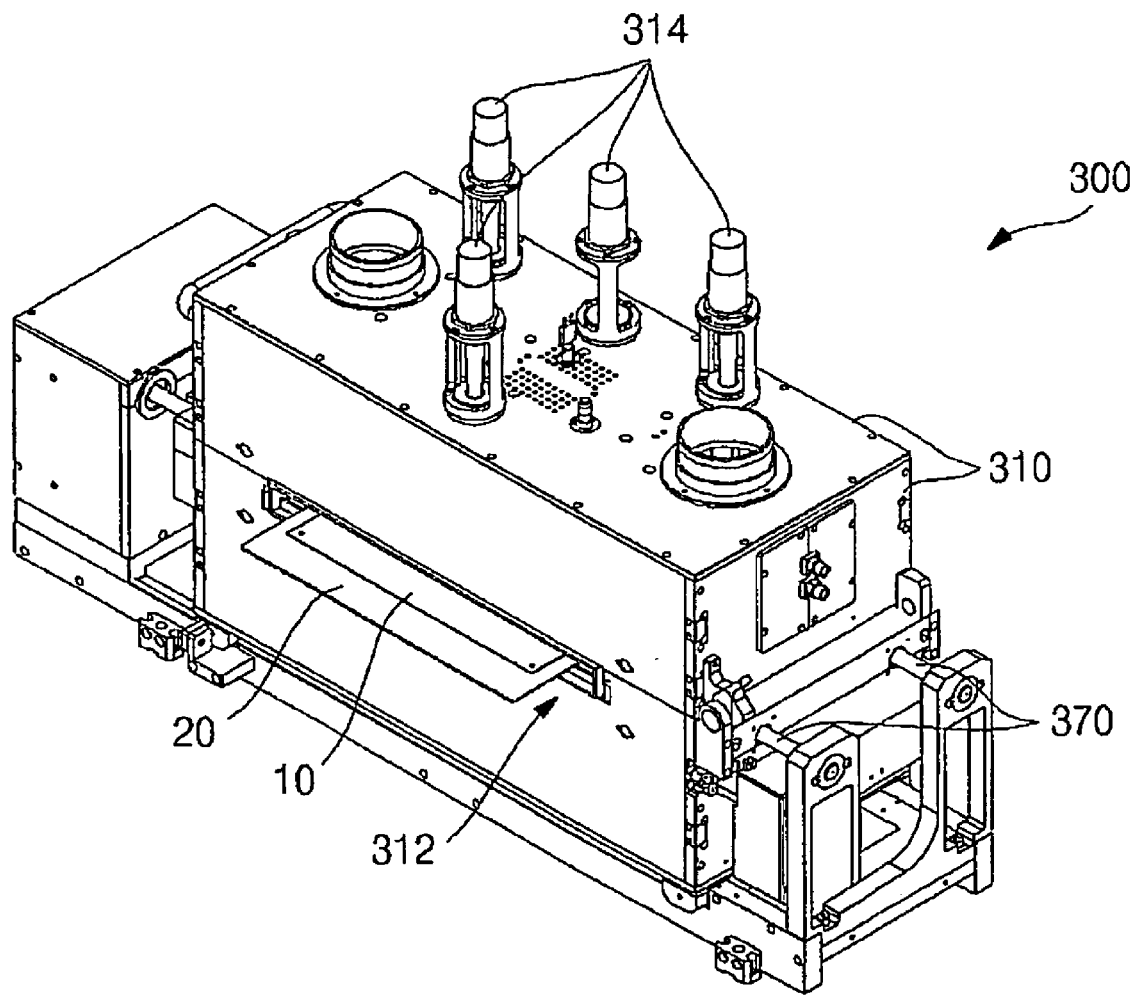
FIG. 7 is a perspective view of a processing unit according to one embodiment of the present invention.
Figure 8:
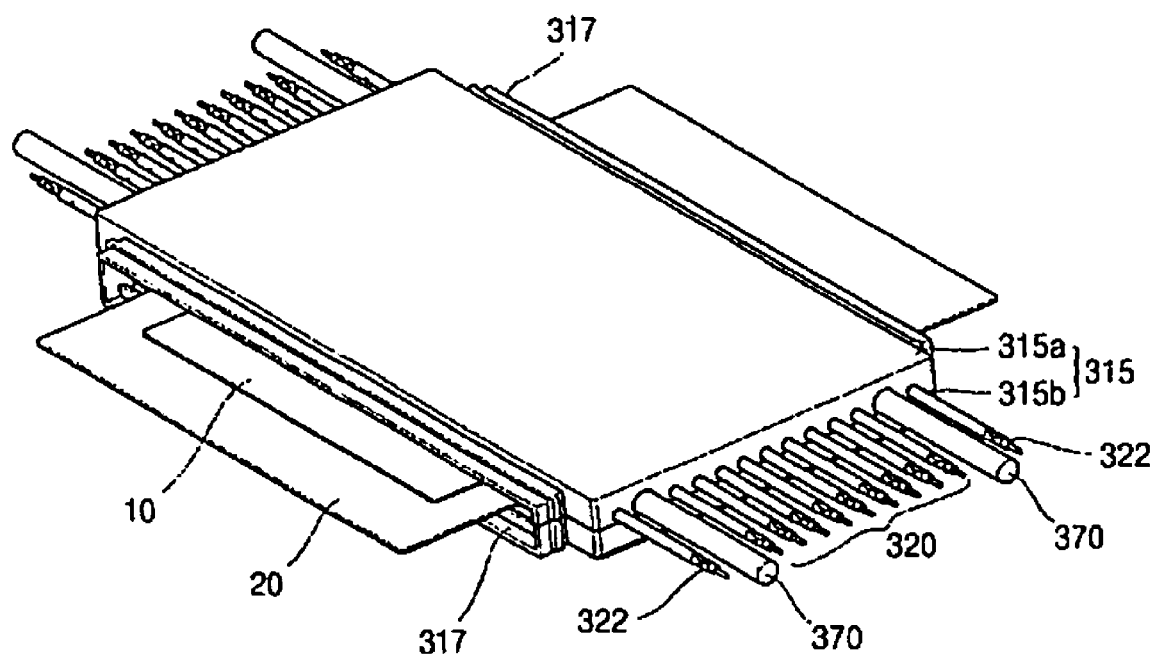
FIG. 8 is a perspective view illustrating an inner housing, a lamp heater and a roller of a processing unit according to one embodiment of the present invention.
Figure 9:
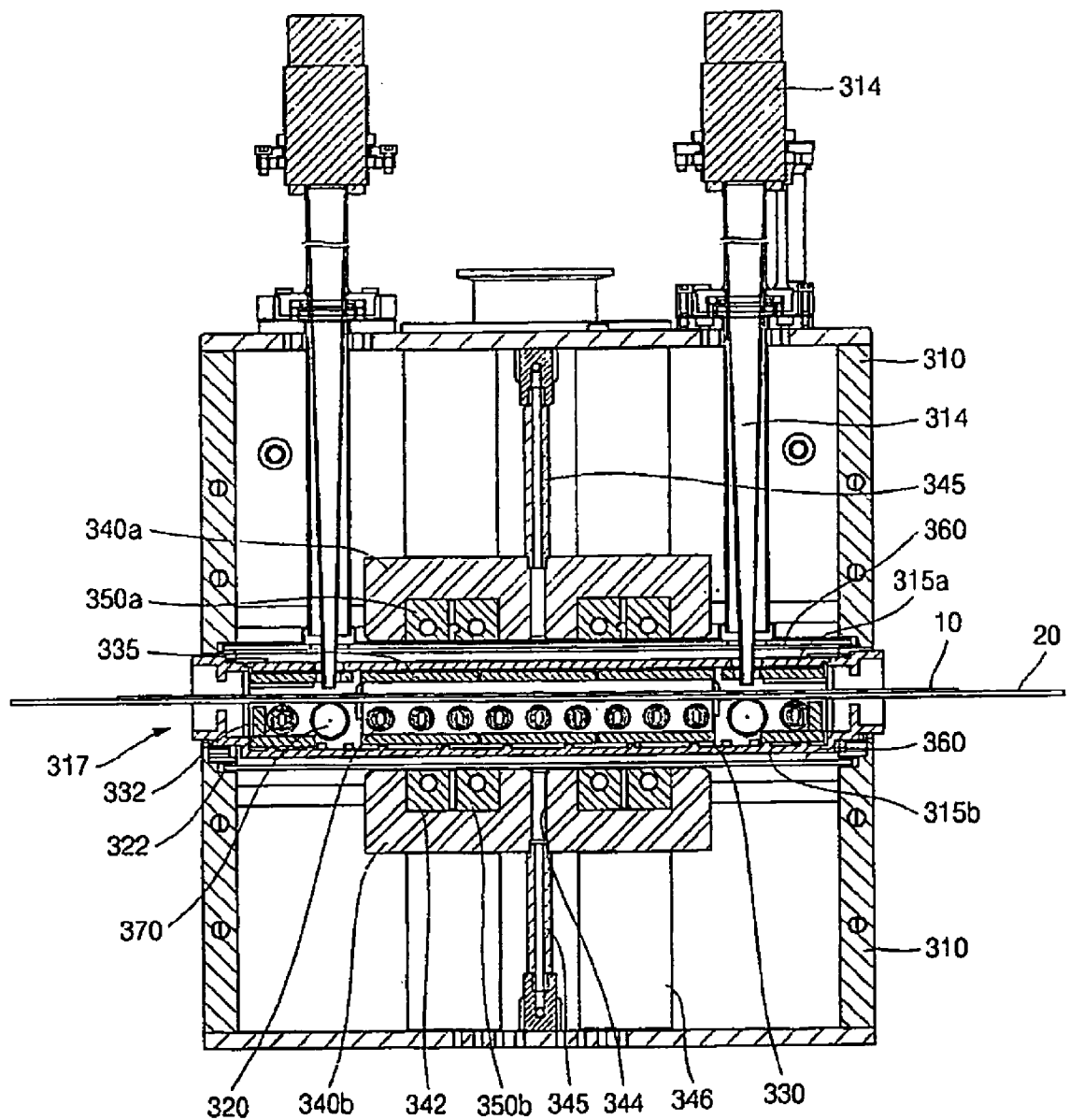
FIG. 9 is a sectional view of a processing unit according to one embodiment of the present invention.
Figure 10:
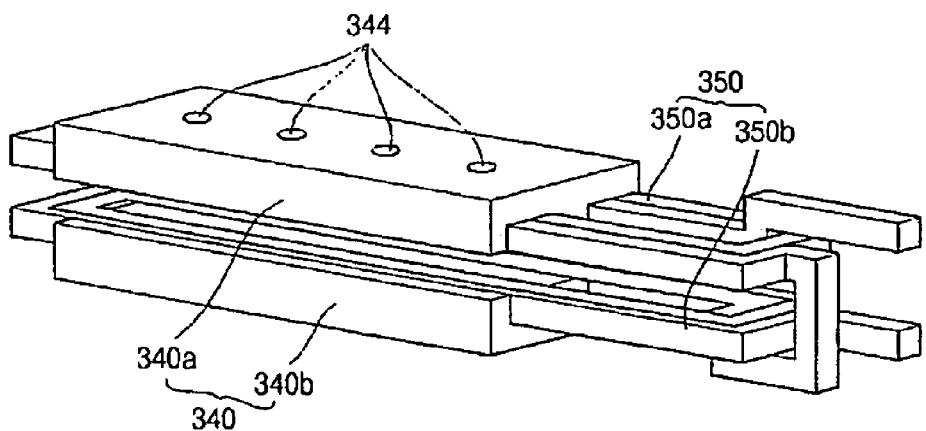
FIG. 10 is a perspective view illustrating a magnetic core and an induction coil according to one embodiment of the present invention.
Figure 11:
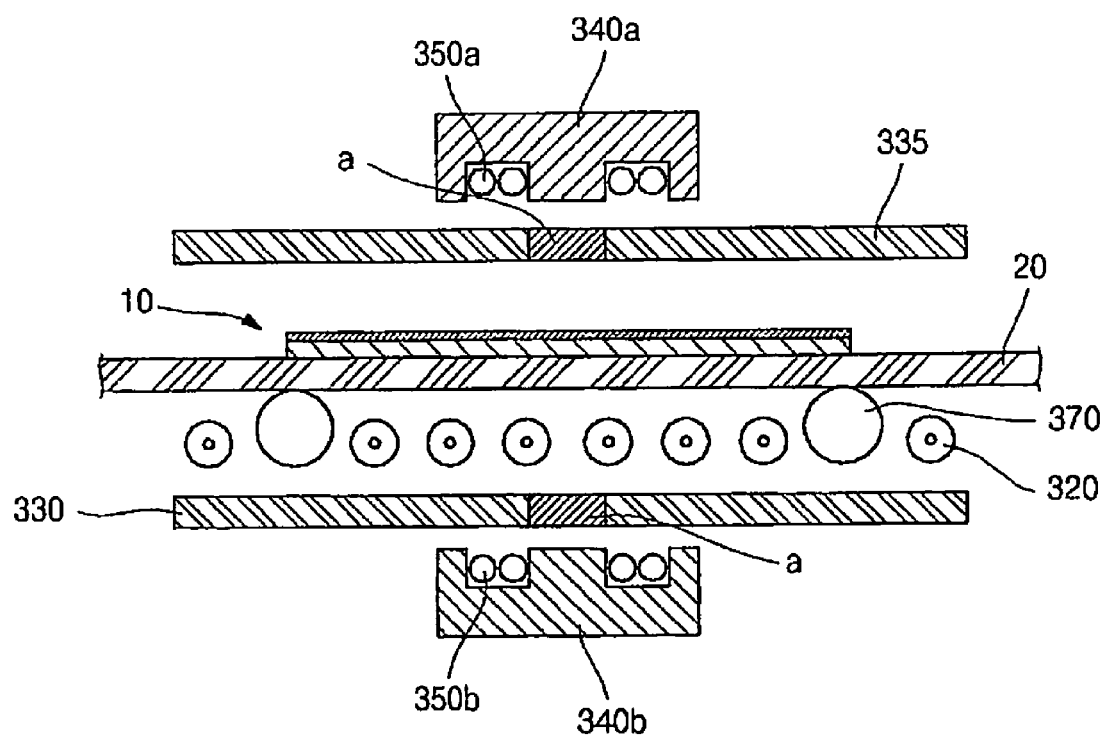
FIG. 11 is a schematic sectional view illustrating an induction heating part of a magnetic core and an induction coil according to one embodiment of the present invention.

FIG. 7 is a perspective view of the processing unit according to one embodiment of the present invention, FIG. 8 is a perspective view illustrating an inner housing, a lamp heater and a roller of the processing unit according to one embodiment of the present invention, FIG. 9 is a sectional view of the processing unit according to one embodiment of the present invention, FIG. 10 is a perspective view illustrating a magnetic core and an induction coil according to one embodiment of the present invention, and FIG. 11 is a schematic sectional view illustrating an induction heating part of the magnetic core and the induction coil according to one embodiment of the present invention.

Referring to FIGS. 7 to 9, the processing unit 300 includes an outer housing 310, an inner housing 315, a lamp heater 320, a first heat body 330, a magnetic core 340, and an induction coil 350. The processing unit 300 can further include a second heat body 335, an adiabatic plate 360 and a roller 370. The processing unit 300 applies heat to the semiconductor device 10 using the lamp heater 320 and the first heat body 330, so that the semiconductor device 10, which has been heated at a predetermined temperature by means of the heating unit 200, can maintain at least the predetermined temperature. In addition, the processing unit 300 can raise the local temperature of the semiconductor device 10 within a short period of time by uniformly heating the semiconductor device 10 through induction heating using the magnetic core 340 and the induction coil 350. In the meantime, although the processing unit 300 is used as a part of the heat treatment system for the semiconductor device according to the present invention, the processing unit 300 can be individually used as heat treatment equipment or as a part of heat treatment equipment for the semiconductor device.

Referring to FIG. 7, the outer housing 310 forms an external appearance of the processing unit 300 and shields heat emitted to the exterior. The outer housing 310 is formed at both lateral sides thereof with inlet and outlet sections 312 for loading and unloading the semiconductor device 10. Preferably, the outer housing 310 is divided into an upper outer housing and a lower outer housing.

Reference numeral 314 is a pyrometer for measuring the temperature of the heat treatment space formed in the processing unit 300. In order to minimize generation of contaminated materials in the heat treatment space, the pyrometer 314 is used instead of the thermocouple. Referring to FIG. 9, the pyrometer 314 is positioned above the semiconductor device 10 in order to measure the temperature of the heat treatment space.

Referring to FIGS. 8 and 9, the inner housing 315 is divided into an upper inner housing 315a and a lower inner housing 315b, which are spaced from each other by a predetermined distance in order to form the heat treatment space for the semiconductor device 10. In addition, the lamp heater 320, the first heat body 330, the second heat body 335 and rollers 370 are installed in the inner housing 315. Thus, the upper inner housing 315a is spaced from the lower inner housing 315b in order to provide a space for installing the lamp heater 320, the first heat body 330, the second heat body 335 and rollers 370. Preferably, the space formed between the upper and lower inner housings 315a and 315b must be minimized for the purpose of temperature uniformity in the heat treatment space. The inner housing 315 is provided at predetermined portions thereof with inner inlet and outlet sections 317 corresponding to the inlet and outlet sections of the outer housing 310 in such a manner that the semiconductor device 10 and the support plate 20 can be introduced into or discharged from the inner housing 315. Preferably, the inner housing 315 is made from quartz in order to prevent contaminated materials from being created in the heat treatment space maintained with the high temperature atmosphere.

The lamp heater 320 consists of a plurality of halogen lamps and is installed at an inner upper portion or an inner lower portion of the inner housing 315. Preferably, the lamp heater 320 is extensively aligned widthwise along the inner housing 315 in order to maximize the heating area of the semiconductor device 10. In addition, it is preferred to install the lamp heater 320 at the lower portion of the inner housing 315, in which the roller 370 is installed, in such a manner that the height of the heat treatment space can be minimized. In this case, the lamp heater 320 heats the semiconductor device 10 from the lower portion of the semiconductor device 10. Preferably, the halogen lamps are aligned vertically to the conveying direction of the semiconductor device 10 and an interval thereof can be adjusted according to the temperature and temperature uniformity of the heat treatment space. In addition, the lamp heater 320 may further include an auxiliary lamp heater 322 installed at the inlet and outlet sections 317 of the inner housing 315. Since halogen lamps of the lamp heater 320 are aligned widthwise along the lamp heater 320 vertically to the conveying direction of the semiconductor device 10, the lamp heater 320 can uniformly heat the semiconductor device 10 lengthwise along the semiconductor device 10. Although the lamp heater 320 preferably includes the halogen lamps, the present invention is not limited thereto. For instance, a lamp capable of generating heat having a visible ray wavelength or an infrared lamp capable of generating heat having an infrared ray wavelength can be used for the lamp heater 320.

The lamp heater 320 generates heat having the visible ray wavelength in order to selectively heat predetermined portions of the semiconductor device 10. The semiconductor device 10 includes a glass substrate coated with a silicon thin film or a metal thin film and is conveyed while being rested on the support plate made from quartz. In this case, since the support plate and the glass substrate have a low absorption characteristic for visible ray irradiated from the halogen lamps of the lamp heater 320, the lamp heater 320 represents relatively low heating efficiency with respect to the support plate and the glass substrate. In contrast, the amorphous silicon thin film or the metal thin film (for example, a gate meal of a TFT device subject to a dopant activation process) coated on the glass substrate represents a high absorption characteristic for the visible ray, so the lamp heater 320 represents relatively high heating efficiency with respect to the amorphous silicon thin film or the metal thin film. That is, the lamp heater 320 rapidly heats the amorphous silicon thin film or the metal thin film coated on the glass substrate within a short period of time.

The first heat body 330 includes a silicon carbide plate or a carbon member coated with silicon carbide. The first heat body 330 can be fabricated in the form of plate blocks having a predetermined size. The first heat body 330 has an area corresponding to an area of the lamp heater 320. In addition, the first heat body 330 is installed between the inner housing 315 and the lamp heater 320 at the upper portion or the lower portion of the inner housing 315. That is, the first heat body 330 is provided at a rear portion of the lamp heater 320 and aligned in the same direction with the lamp heater 320 when viewed from the semiconductor device 10 being conveyed. In this case, the lamp heater 320 heats the first block body 330 while directly heating the semiconductor device 10 from the lower portion of the semiconductor device 10, so the first heat body 330 can be effectively heated. However, it is also possible to align the first heat body 330 in opposition to the lamp heater 320 about the semiconductor device 10.

The first heat body 330 has characteristics of absorbing light having various wavelengths, so the first heat body 330 has the temperature above 800° C. by absorbing radiation heat generated from the lamp heater 320 and generates heat having an infrared ray wavelength. Thus, the first heat body 330 can selectively heat predetermined portions of the glass substrate of the semiconductor device 10 or the support plate 20. Since the amorphous silicon thin film or the metal thin film of the semiconductor device 10 is selectively heated by means of the lamp heater 320, the glass substrate may be deformed if heat having a high temperature is applied to the amorphous silicon thin film or the metal thin film. Thus, it is necessary to properly heat the glass substrate and the support plate when the amorphous silicon thin film of the semiconductor device is heated. The first heat body 330 allows the glass substrate of the semiconductor device 10 and the support plate 20 made from quartz to be effectively heated, thereby reducing the temperature difference between the glass substrate and the amorphous silicon thin film or the support plate 20 and the amorphous silicon thin film.

The first heat body 330 may further include an adiabatic heat body 332 positioned between the inner inlet and outlet sections 337 of the inner housing 315 and outermost halogen lamps of the lamp heater 320 in order to prevent heat of the lamp heater 320 from being leaked through the inlet and outlet sections 337 of the inner housing 315. The adiabatic heat body 332 has a height corresponding to that of the lamp heater 320 and a length corresponding to that of the inlet and outlet sections 337 of the inner housing 315.

Similarly to the first heat body 330, the second heat body 335 includes a silicon carbide plate or a carbon member coated with silicon carbide. The second heat body 335 is installed in an area corresponding to an installation area of the first heat body 330. In addition, the second heat body 335 is installed in opposition to the first heat body 330 about the semiconductor device 10 and heated by means of the lamp heater 320, thereby heating the semiconductor device 10. Accordingly, when the first heat body 330 is installed at the lower portion of the inner housing 315, the second black heat body 315 is installed at the upper portion of the inner housing 315 while facing the upper surface of the semiconductor device 10 being conveyed in order to heat the semiconductor device 10. If the first heat body 330 is installed at the upper portion of the inner housing 315, the second heat body 335 is installed at the lower portion of the inner housing 315.

Referring to FIG. 9, the magnetic core 340 is made from a material having magnetic characteristics. Preferably, the magnetic core 340 is made from composite materials including magnetic powder, such as iron or ferrite, and resin. If the magnetic core 340 is made from a metal or a magnetic oxide material, great energy loss may occur in a high frequency band. However, if the magnetic core 340 is made from the composite material including magnetic powder and resin, the energy loss in the high frequency band can be minimized. At this time, various kinds of resin, such as epoxy resin, can be used to fabricate the magnetic core 340.

The magnetic core 340 includes an upper magnetic core 340a and a lower magnetic core 340b, which are provided at an outside of the inner housing 315 and aligned corresponding to upper and lower portions of the inner housing while being spaced from the inner housing 315 by a predetermined distance. The upper and lower magnetic core 340a and 340b are symmetrically formed about the inner housing 315 in such a manner that induction heating derived from induced electromotive force is generated in corresponding areas of the first and second black bodies 330 and 335. Preferably, the magnetic core 340 is formed at one surface thereof facing the inner housing 315 with an induction coil recess 342 for receiving the induction coil 350. The induction coil recess 342 is formed at a lower surface of the upper magnetic coil 340a and an upper surface of the upper magnetic coil, respectively. The magnetic core 340 has a length at least corresponding to the length of the semiconductor device 10 (that is, the length of the semiconductor device extending vertically to the conveying direction thereof) in order to allow the semiconductor device 10 to be uniformly heated in the length direction thereof. In addition, the magnetic core 340 has a predetermined width in order to locally heat the predetermined portion of the semiconductor device 10 together with the induction coil 350. That is, the magnetic core 340 is designed such that a distance between induction coil recesses 242 equals to a heating width of the semiconductor device 10. Preferably, the magnetic core 340 is designed such that it can heat an area in a range of about 5 to 200 mm.

The magnetic core 340 is spaced from the inner housing 315 by a predetermined distance. In addition, cooling gas is fed between the magnetic core 340 and the inner housing 315 so that heat generated in the inner housing 315 cannot be transferred to the magnetic core 340. Accordingly, it is preferred to form cooling gas spraying holes 344 at a center area of the magnetic core 340 between the induction coil recesses 342 in such a manner that gas is fed into the center area of the magnetic core 340 and flows through a peripheral area of the magnetic core 340, thereby cooling the magnetic core 340. The size, the diameter and the number of the cooling gas spraying holes 344 are properly determined according to the length of the magnetic core 340. It is also possible to provide a separate gas pipe at a side of the magnetic core 340 in stead of forming the cooling gas spraying holes 344. The cooling gas spraying holes 344 are connected to a separate cooling gas feeding pipe 345 in order to receive cooling gas from an external gas source.

Reference numeral 346 is a support bracket for supporting the magnetic core 340 by coupling the magnetic core 340 with the outer housing 310.

Referring to FIG. 10, the induction coil 350 includes an upper induction coil 350a and a lower induction coil 350b, which are installed in the induction coil recesses 342 of the upper and lower magnetic cores 340a and 340b provided in the upper and lower portions of the inner housing 315. Preferably, the upper induction coil 350a is electrically connected to the lower induction coil 350b so that they can be simultaneously controlled. A hollow section can be formed in the induction coil 350 such that cooling water can flow passing through the induction coil 350.

Referring to FIG. 11, the magnetic core 340 and the induction coil 350 locally heat predetermined areas (a) of the first and second heat bodies 330 and 335 by means of induction heating derived from induced electromotive force. The induction coil 350 is connected to a high frequency AC power supply (not shown) and a matching system (not shown) for correcting impedance of the power supply and the induction coil so that the current having a predetermined frequency is applied to the induction coil 350. That is, the current having the frequency in a range of about 10 KHz to 100 MHz is applied to the induction coil 350, and the magnetic core 340 and the induction coil 350 generate induction current in the predetermined areas of the first and second heat bodies 330 and 335 based on the current applied to the induction coil 350. Thus, the first and second heat bodies 330 and 335 can locally heat the semiconductor device 10 at a high temperature. As mentioned above, the lamp heater 320 generates heat having the visible ray wavelength, thereby directly heating the predetermined portion of the semiconductor device 10 and indirectly heating the first and second heat bodies 330 and 335. At this time, the first and second heat bodies 330 and 335 may emit infrared ray, thereby generating other parts of the semiconductor device 10. The heat having the visible ray wavelength generated from the lamp heater 320 can be controlled by adjusting the current applied to the halogen lamps of the lamp heater 320. If current applied to the halogen lamps is increased, the temperature of the first and second heat bodies 330 and 335 is also increased so that the amount of infrared ray may be increased. Thus, it is difficult to individually control the visible ray heat and infrared ray heat. For this reason, the magnetic core 340 and the induction coil 350 locally heat the first and second heat bodies 330 and 335 by means of induction heating separately from the lamp heater 320, thereby controlling the infrared ray heating. If the first and second heat bodies 330 and 335 are heated by means of induction heating, heating efficiency thereof may be improved as compared with resistance heating. In addition, differently from the resistance heating, the induction heating may not require an electrode and a wiring connected to the first heat body 330, so the structure of the heat treatment system can be simplified if the heat treatment system employs the induction heating.

The adiabatic plate 360 is preferably made from quartz. However, the present invention does not limit materials for the adiabatic plate 360. Various materials can be used for fabricating the adiabatic plate 360 if they have adiabatic characteristics. The adiabatic plate 360 has an area at least corresponding to an area of the inner housing 315 and installed between the inner housing 315 and the magnetic core 340. The adiabatic plate 360 includes an upper adiabatic plate 360a installed between the upper inner housing 315a and the upper magnetic core 340a and a lower adiabatic plate 360b installed between the lower inner housing 315b and the lower magnetic core 340b. The adiabatic plate 360 prevents heat of the inner housing 315 from being transferred to the magnetic core 340, the induction coil 350 and the outer housing 310.

The rollers 370 are preferably made from quartz in order to minimize generation of contaminated materials in the inner housing 315. The rollers 370 have cylindrical shapes and aligned in the inner housing 315 while being spaced from each other by a predetermined distance corresponding to the sizes of the inner housing 315 and the support plate 20 to be conveyed. Since the width of the processing unit is smaller than that of the heating unit 200 or the cooling unit 400, it is possible to provide a relatively smaller number of rollers 370, for instance, two rollers 370. If the lamp heater 320 is installed at the lower portion of the inner housing 315, it is necessary to increase the number of lamp heaters 320 while reducing the number of rollers 370 for uniformly heating the semiconductor device. The rollers 370 are aligned vertically to the conveying direction of the support plate 20 and extend out of the outer housing 310. In addition, the rollers 370 are rotated by means of a separate rotating unit (not shown) in order to convey the support plate 20 and the semiconductor device 10 in the predetermined direction.

Figure 12:
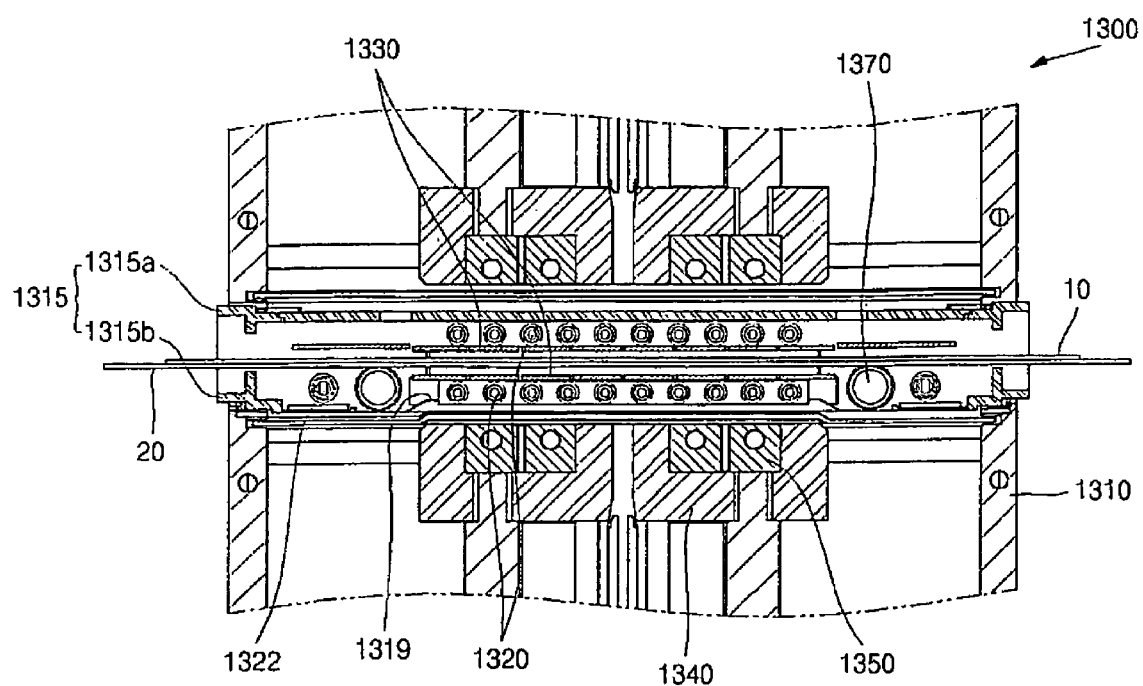
FIG. 12 is a sectional view of a processing unit according to another embodiment of the present invention.
Figure 13:
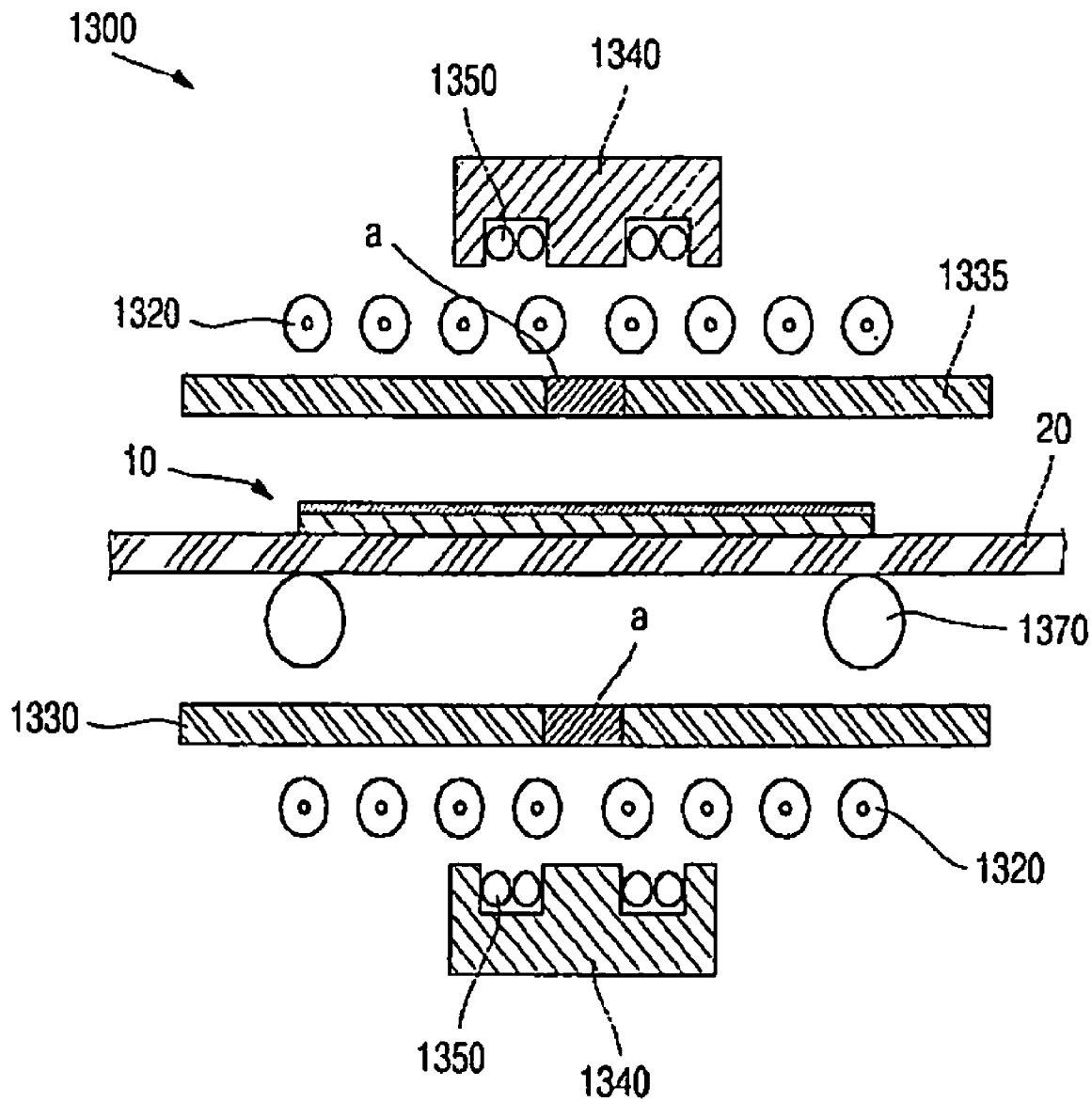
FIG. 13 is a schematic sectional view illustrating an induction heating part of a magnetic core and an induction coil according to another embodiment of the present invention.

FIG. 12 is a sectional view of a processing unit according to another embodiment of the present invention, and FIG. 13 is a schematic sectional view illustrating an induction heating part of a magnetic core and an induction coil according to another embodiment of the present invention.

Referring to FIGS. 12 and 13, the processing unit 1300 according to another embodiment of the present invention includes an outer housing 1310, an inner housing 1315, a lamp heater 1320, a heat body 1330, a magnetic core 1340 and an induction coil 1350. In addition, the processing unit 1300 may further include an adiabatic plate (not shown) and rollers 1370. Since the structures of the outer housing 1310, the inner housing 1315, the magnetic core 1340, the induction coil 1350 and the rollers 1370 are identical to those of processing unit 300 shown in FIG. 7, they will not be further described below. Thus, the following description will be focused on parts of the processing unit 1300 different from those of the processing unit 300.

The inner housing 1315 includes an upper inner housing 1315a and a lower inner housing 1315b and forms a heat treatment space for the semiconductor device 10 therein. A protrusion 1319 having an area corresponding to an installation area for the lamp heater 1320 and the heat body 1330 is formed at the lower inner housing 1315b with a predetermined height. Since the rollers 1370 are installed on the lower inner housing 1315b in order to convey the semiconductor device 10, a distance between the semiconductor device 10 and the lower inner housing 1315b is larger than a distance between the semiconductor device 10 and the upper inner housing 1315a. For this reason, the protrusion 1319 is formed on the lower inner housing 1315b in such a manner that the lamp heater 1320 and the heat body 1330 positioned below the semiconductor device 10 can be spaced from the semiconductor device 10 with the same distance as the lamp heater 1320 and the heat body 1330 positioned above the semiconductor device 10. However, it is not necessary to integrally form the protrusion 1319 with the lower inner housing 1315b. The protrusion 1319 can be fabricated as an individual block.

The lamp heaters 1320 are installed at inner upper and inner lower portions of the inner housing 1315 vertically to the conveying direction of the semiconductor device 10. In addition, the lamp heaters 1320 are aligned in parallel to the surface of the semiconductor device 10. The installation area for the lamp heaters 1320 can be adjusted by taking the heat treatment characteristics of the semiconductor device, the heat treatment temperature of the semiconductor device and high temperature heating time into consideration.

In addition, auxiliary lamp heaters 1322 are installed at an inlet section and an outlet section of the inner housing 1315, respectively, in order to additionally heat the semiconductor device 10 and the support plate 20, thereby preventing sudden temperature variation.

The heat body 1330 is installed at upper and lower portions of the inner housing 1315 between the lamp heaters 1320 and the semiconductor device 10 corresponding to the installation area of the lamp heaters 1320 while being spaced from the semiconductor device 10 by a predetermined distance. Thus, the heat body 1330 emits infrared ray by receiving heat from the lamp heaters 1320, thereby heating the semiconductor device 10 being conveyed. The heat body 1330 is aligned adjacent to the semiconductor device 10 and the support plate 30. Preferably, the upper portion of the heat body 1330 is spaced from the upper surface of the semiconductor device 10 and the lower portion of the heat body 1330 is spaced from the lower surface of the support plate 20 by the same distance in order to uniformly heat the semiconductor device 10 and the support plate 20. Thus, lower portions of the lamp heaters 1320 and the heat body 1330 installed on the protrusion 1317, which protrudes from the lower inner housing 1315b or is formed as an individual block.

The heat body 1330 may be additionally installed in an installation area of the auxiliary lamp heater 1322. In this case, the heat body 1330 emits infrared ray by receiving heat from the auxiliary lamp heater 1322, thereby preventing sudden temperature variation of the semiconductor device 10 and the support plate 20 at the inlet and outlet sections of the inner housing 1315.

The magnetic core 1340 and the induction coil 1350 are installed at upper and lower portions of the inner housing 1315, respectively, to heat the heat body 1330 installed at the central region of the inner housing 1315 through induction heating.

The rollers 1370 are aligned at the lower portion of the inner housing 1315 with a predetermined interval to convey the support plate 20. Preferably, the rollers 1370 are installed at an outer portion of a heat treatment area for the semiconductor device 10, in which the lamp heaters 1320 are provided, in order to uniformly maintain the temperature of the heat treatment area for the semiconductor device 10. Preferably, the rollers 1370 are installed between the inlet section of the inner housing 1315 and the installation area of the lamp heaters 1320.

Referring to FIG. 13, since the processing unit 1300 according to another embodiment of the present invention performs the heat treatment process by means of infrared ray heat of the heat body 1330, which is heated by the lamp heaters 1320 and induction heating, the glass substrate and the support plate can be heated simultaneously with the amorphous silicon thin film or the poly-crystalline silicon thin film during the crystallization process or the dopant activation process.

Similarly to the heating unit 200, the cooling unit 400 includes at least two furnaces 410 in order to cool the support plate 20 and the semiconductor device 10, which have been heated by the heating unit 200 or the processing unit 300, in such a manner that the support plate 20 and the semiconductor device 10 can be prevented from being deformed. The cooling unit 400 may include a plurality of furnaces 410 if it is necessary to gradually cool the support plate 20 and the semiconductor device 10 at a sufficiently low temperature. The furnaces 410 of the cooling unit 400 are maintained with predetermined temperature levels, which are preset differently from each other according to the steps of the heat treatment process within a temperature range lower than the heat treatment temperature, in order to cool the support plate 20 and the semiconductor device 10 and maintain the temperature of the support plate 20 and the semiconductor device 10. In addition, the furnaces 410 can be provided with a gas feeding unit (not shown) for receiving gas from an external gas source. In this case, the furnace 410 can more effectively and uniformly cool the support plate 20 and the semiconductor device 10 by feeding cooling gas onto the support plate 20 and the semiconductor device 10. In order to avoid redundancy, additional description will be omitted in relation to parts of the furnace 410 of the cooling unit 400 identical to the parts of the furnace 210 of the heating unit 200.

Figure 14A:
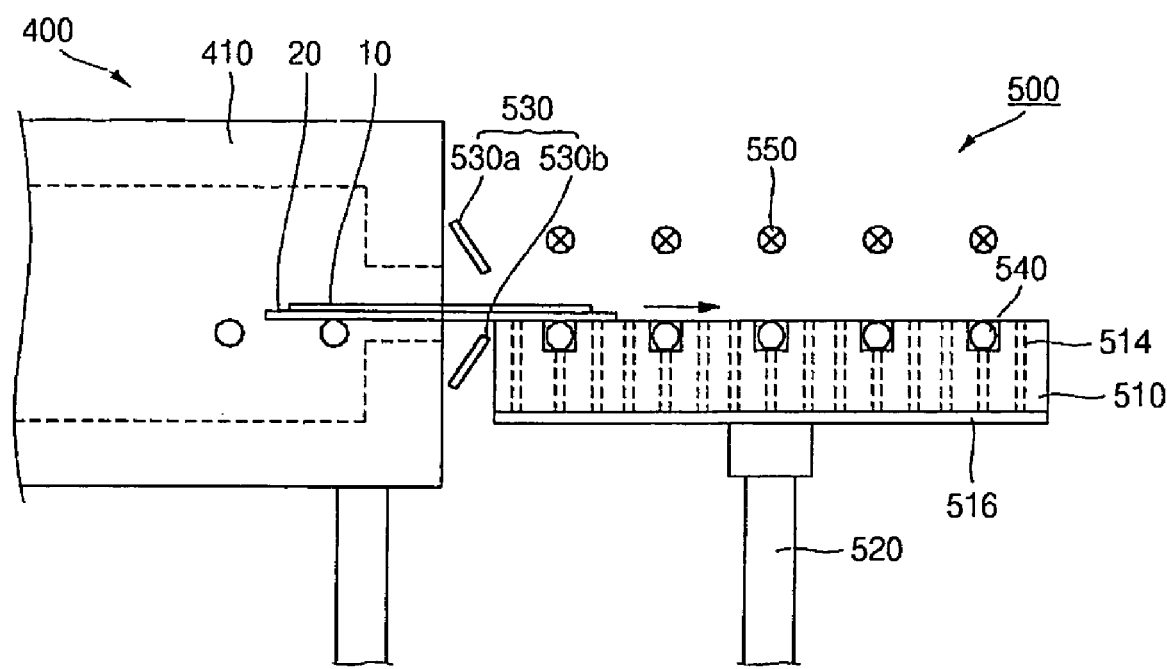
FIG. 14a is a front view of an unloading unit, which is a part of a heat treatment system for semiconductor devices according to one embodiment of the present invention.
Figure 14B:
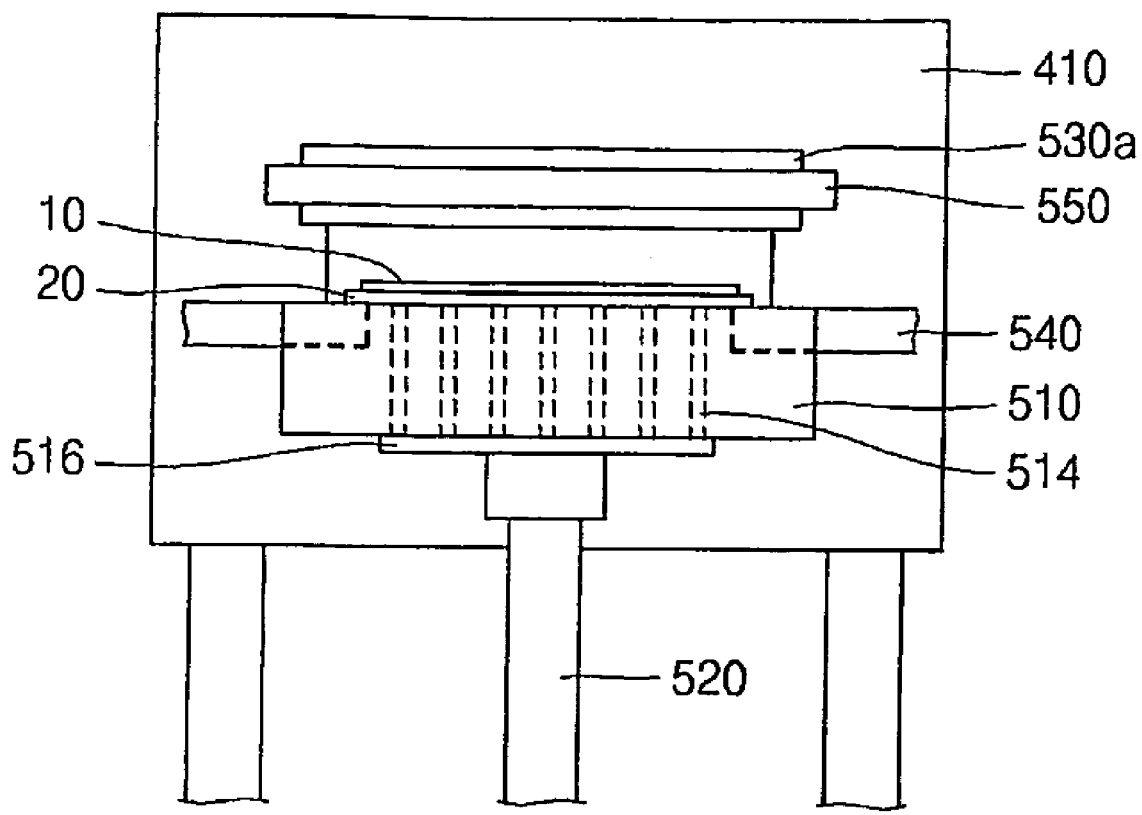
Figure 15A:
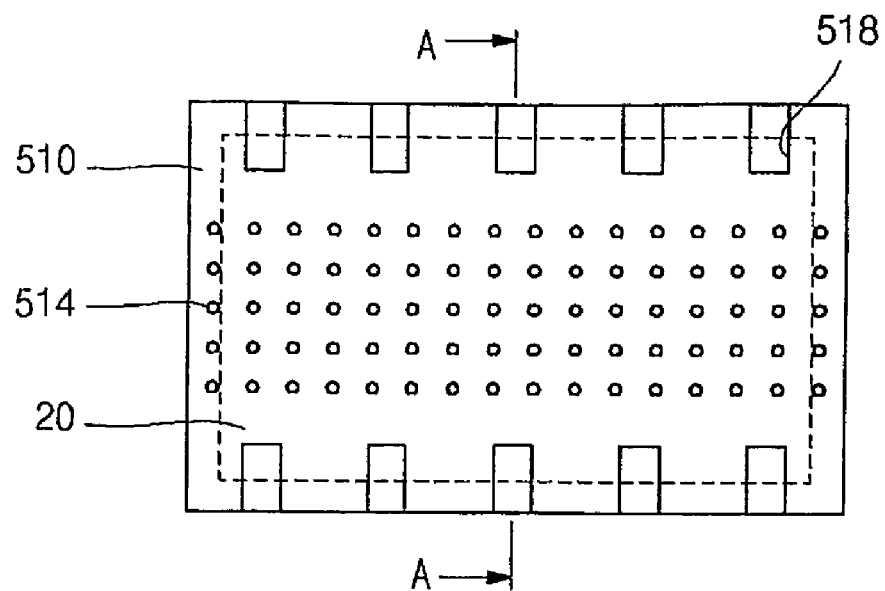
FIG. 15a is a plan view of a cooling susceptor forming an unloading unit.
Figure 15B:
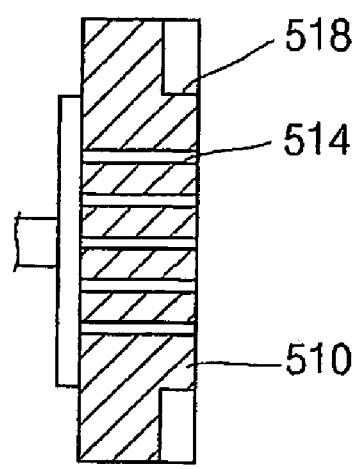

FIG. 14a is a front view of an unloading unit, which is a part of a heat treatment system for semiconductor devices according to one embodiment of the present invention, FIG. 14b is a side view of FIG. 14a, FIG. 15a is a plan view of a cooling susceptor forming the unloading unit, and FIG. 15b is a sectional view taken along line A-A shown in FIG. 15a.

Referring to FIGS. 14a and 14b, the unloading unit 500 of the present invention includes a cooling susceptor 510, a lifting device 520, a gas spraying nozzle 530 and a horizontal conveyance device 540. In addition, the unloading unit 500 further includes an upper heating device 550.

Referring to FIGS. 15a and 15b, the cooling susceptor 510 has a horizontal plate shape having an area larger than an area of the support plate 20 rested on an upper surface 511 of the cooling susceptor 510. In addition, spraying holes 514 are formed in the cooling susceptor 510. The upper surface 511 of the cooling susceptor 510 is positioned corresponding to the outlet section of the cooling unit 400. In addition, the cooling susceptor 510 may include cooling roller recesses 518 for accommodating rollers of the horizontal conveyance device 540 used for horizontally moving the support plate 20. The cooling susceptor 510 is made from a material having superior thermal conductivity such that conductive heat of the support plate 20 and the semiconductor device 10 can be rapidly emitted to the exterior. The cooling susceptor 510 is made from one selected from the group consisting of aluminum, aluminum alloys, graphite, aluminum oxide, aluminum nitride, and boron nitride. However, the present invention is not limited to the above materials.

The spraying holes 514 are aligned in a predetermined portion of the cooling susceptor 510 while passing through the cooling susceptor 510. Thus, cooling gas is fed onto the support plate 20 rested on the upper surface 511 of the cooling susceptor 510 and the lower surface of the semiconductor device 10 through the spraying holes 514 so that the support plate 20 can be uniformly cooled. That is, when the support plate 20 conveyed from the cooling unit 400 is exposed to the exterior, the outer peripheral portion of the support plate 20 may be rapidly cooled than the center portion of the support plate 20, causing the temperature difference in the support plate 20. Thus, cooling gas is sprayed onto the support plate 20 from the lower portion thereof through the spraying holes 514 when the support plate 20 is conveyed onto the upper surface of the cooling susceptor 510, thereby uniformly cooling the support plate 20.

The size and the shape of the spraying holes 514 are properly selected according to the size and the unloading temperature of the support plate 20 and the semiconductor device 10. The spraying holes 514 are cylindrical holes formed in the central area of the cooling susceptor 510 while extending in the thickness direction of the cooling susceptor 510 by passing through the cooling susceptor 510. However, the spraying holes 514 may have polygonal sectional shapes, such as triangular shapes or rectangular shapes. Preferably, the central area of the cooling susceptor 510 having the spraying holes 514 has a width corresponding to at least 50% of a width of the support plate 20 conveyed onto the upper surface of the cooling susceptor 510. If the installation area (that is, the central area of the cooling susceptor 510) of the spraying holes 514 has a width less than 50% of the width of the support plate 20, the support plate 20 and the semiconductor device 10 cannot be uniformly cooled in the width direction thereof, so that the support plate 20 and the semiconductor device 10 can be deformed due to a local temperature difference thereof. Herein, the spraying holes 514 are not formed at an area corresponding to front and rear sides of the roller recesses 518 of the cooling susceptor 510. In addition, the spraying holes 514 can be formed along the whole length of cooling susceptor 510.

The size of the spraying hole 514 and an interval between spraying holes 514 can be properly adjusted. Preferably, the spraying hole 514 has a diameter of about 0.5 to 3 mm, more preferably, 0.5 to 1.5 mm. If the spraying hole 514 has a polygonal sectional shape, a width of the spraying hole 514 is preferably 0.5 to 3 mm. If the diameter of the spraying hole 514 is smaller than 0.5 mm, an amount of spraying gas may be reduced, thereby degrading the cooling efficiency and causing clogging of the spraying hole 514. In contrast, the diameter of the spraying hole 514 is larger than 3 mm, an amount of spraying gas may be excessively increased, thereby causing the local temperature difference. In addition, the interval between spraying holes 514 is larger than the diameter of the spraying hole 514. Preferably, the interval is larger than the diameter of the spraying hole 514 by at least five times. If the interval is smaller than the diameter of the spraying hole 514, the spraying holes 514 may be deformed or clogged, thereby lowering endurance of the cooling susceptor 510.

The lower surface 512 of the cooling susceptor 510 is connected to a gas feeding unit 516 for feeding gas into the spraying holes 514. The gas feeding unit 516 can be provided at a lateral side of the cooling susceptor 510 corresponding to the alignment of the spraying holes 514.

The cooling roller recesses 518 are formed at front and rear sides of the cooling susceptor 510 with a predetermined interval and have lengths sufficient for making contact with front and rear portions of the support plate 20 rested on the upper surface of the cooling susceptor 510. In addition, the cooling roller recesses 519 have predetermined depths in such a manner that the rollers 540 are prevented from protruding out of the cooling roller recesses 519 when the cooling susceptor 510 and the support plate 20 are moved upwards. During the cooling process, the support plate 20 uniformly makes contact with the upper surface 511 of the cooling susceptor 510 of the lifting device 520. When the cooling process has been finished, the cooling susceptor 510 is moved down and conveyed in the left or right direction while being supported by the rollers 540 accommodated in the cooling roller recesses 518. The cooling roller recesses 518 can be used only when the rollers are used as the horizontal conveyance device 540.

The lifting device 520 is coupled with the lower surface 512 of the cooling susceptor 510 so as to move the cooling susceptor 510 up and down. When the support plate 20 is conveyed from the cooling unit 400, the lifting device 520 allows the cooling susceptor 510 to be maintained in a lower position in such a manner that the rollers 540 protrude from the upper surface of the support plate 20. In contrast, if the support plate 20 has been conveyed onto the lifting device 510, the lifting device 520 moves the cooling susceptor 510 upwards such that the support plate 20 can be rested on the upper surface of the cooling susceptor 510. In addition, when the cooling process for the support plate 20 and the semiconductor device has been finished, the lifting device 520 moves the cooling susceptor 510 downwards so that the support plate 20 can be conveyed in the left or right direction by means of the rollers. The lifting device 520 includes a pneumatic cylinder, a ball screw unit or a timing belt. Preferably, the pneumatic cylinder is used as the lifting device 520. However, the present invention does not limit the kind of the lifting devices, if they can move the susceptor 510 up and down. In addition, the number of the lifting devices can be properly selected by taking the weight and the area of the susceptor 510 into consideration.

The gas spraying nozzle 530 includes an upper nozzle 530a and a lower nozzle 530b, wherein the upper nozzle 530a and the lower nozzle 530b may consist of a plurality of nozzles coupled with each other while forming a predetermined width or one nozzle unit having a predetermined width. The gas spraying nozzle 530 sprays gas, such as nitride gas, in order to forcibly cool the support plate 20 and the semiconductor device 10. A size of an outlet of the gas spraying nozzle 530 may be determined by taking the required cooling speed and the conveying speed of the support plate 20 into consideration. Accordingly, if it is necessary to increase the cooling speed or the conveying speed of the support plate 20, it is preferred to increase an amount of gas to be sprayed by enlarging the size of the outlet of the gas spraying nozzle 530. In contrast, if it is necessary to reduce the cooling speed or the conveying speed of the support plate 20, it is preferred to reduce an amount of gas to be sprayed by reducing the size of the outlet of the gas spraying nozzle 530. Preferably, the gas spraying nozzle 530 has a width larger than that of the support plate 20 in order to uniformly cool the support plate 20 widthwise along the support plate 20. The upper nozzle 530a and the lower nozzle 530b of the gas spraying nozzle 530 are aligned at one side of the cooling susceptor 510 adjacent to the cooling unit 400 while being spaced from each other about the upper surface of the cooling susceptor 510 by a predetermined distance, which is larger than the total thickness of the support plate 20 and the semiconductor device 10. In addition, the upper nozzle 530a and the lower nozzle 530b of the gas spraying nozzle 530 may spray gas onto the support plate 20 while forming a predetermined spraying angle with respect to the conveying direction of the support plate 20. Preferably, the spraying angle is an obtuse angle. In addition, it is also possible to allow the upper nozzle 530a and the lower nozzle 530b of the gas spraying nozzle 530 to have mutually different spraying angles. Also, the upper nozzle 530a and the lower nozzle 530b of the gas spraying nozzle 530 can be aligned such that they can cool various portions of the support plate 20. Gas sprayed from the gas spraying nozzle 530 may flow through the surfaces of the support plate 20 and the semiconductor device 10 in order to cool the support plate 20 and the semiconductor device 10 without interrupting the movement of the support plate 20.

The horizontal conveyance device 540 transfers the support plate 20 the next process stage by horizontally conveying the support plate 20 from the unloading unit 500. Preferably, the horizontal conveyance device 540 includes rollers rotatably accommodated in the cooling roller recesses 518 of the cooling susceptor 510. In this case, the rollers 540 are spaced from each other with a predetermined interval by taking the size of the support plate 20 to be conveyed into consideration. The rollers 540 are rotatably supported by means of a separate supporting unit (not shown) and rotated by means of a separate driving unit (not shown). Therefore, a plurality of rollers 540 are horizontally disposed while forming the predetermined interval therebetween and are rotated in order to horizontally convey the support plate 20 rested on the rollers 540.

Besides the rollers, a pneumatic cylinder or a ball screw unit can be used as the horizontal conveyance device 540. The present invention does not limit the kind of the horizontal conveyance devices. If the pneumatic cylinder or the ball screw unit is used as the horizontal conveyance device 540, it is not necessary to form the roller recesses 518 in the upper surface of the cooling susceptor 510.

The upper heating device 550 includes a plurality of resistance heaters or lamp heaters. Preferably, the upper heating device 550 consists of lamp heaters including infrared halogen lamps. However, the present invention does not limit the kind of the upper heating devices if they can heat the semiconductor device 10 without contaminating the upper surface of the semiconductor device 10. The upper heating device 550 is positioned at the upper portion of the cooling susceptor 510 with a predetermined height and has an area larger than an area of the support plate 20 being conveyed. Accordingly, the upper heating device 550 aligned above the semiconductor device 10 uniformly applies heat over the whole area of the upper surface of the semiconductor device 10 placed on the support plate 20, thereby preventing the upper surface of the semiconductor device 10 from being rapidly cooled. When the support plate 20 and the semiconductor device 10 are moved onto the upper surface of the cooling susceptor 510, the upper surface of the semiconductor device 10 is exposed to the exterior so that the semiconductor device 10 may emit heat to the exterior. Thus, the upper surface of the semiconductor device 10 may be rapidly cooled than the lower surface of the semiconductor device 10. In this case, the semiconductor device 10 may be damaged or deformed due to the rapid cooling speed and the temperature difference between the upper and lower surfaces of the semiconductor device 10. Thus, the upper heating device 550 is controlled such that it has a proper temperature by taking the temperature of the support plate 20 and the semiconductor device 10 in the cooling unit 400 into consideration. In addition, the upper heating device 550 has thermal capacity capable of allowing the upper surface of the semiconductor device 10 to be maintained with a temperature above 100° C. at an initial cooling stage. The upper heating device 550 stops its operation when the temperature of the support plate 20 and the semiconductor device 10, which is detected by a separate temperature detecting device (not shown), drops below 100° C.

Hereinafter, an operation of the heat treatment system for the semiconductor device according to the present invention will be described.

First, when the susceptor 110 of the loading unit 100 is moved upwards by means of the lifting device 130, the support plate 20 and the semiconductor device 10 are loaded on the upper surface of the susceptor 110. Thus, the support plate 20 and the semiconductor device 10 are preheated with a predetermined temperature by means of the heating device 114 accommodated in the susceptor 110. At this time, due to the adiabatic slots 116 formed at the center portion of the susceptor 110, heat is differentially transferred to the center portions and the outer peripheral portions of the support plate 20 and the semiconductor device 10 so that the support plate 20 and the semiconductor device 10 can be uniformly heated. When the support plate 20 and the semiconductor device 10 have been preheated with the predetermined temperature, the susceptor 110 is moved down by means of the lifting device 130 and the support plate 20 and the semiconductor device 10 are conveyed into the furnaces 210 of the heating unit 200 by means of the rollers 140.

Since the furnaces 210 of the heating unit 200 have predetermined temperature levels, which are preset differently from each other according to the steps of the heat treatment process, the support plate 20 and the semiconductor device 10 can be gradually heated with the predetermined temperature by means of the furnaces 210 of the heating unit 200. At this time, the temperature of the last furnace is the same as the heat treatment temperature in such a manner that the semiconductor device can be partially heat-treated in the heating unit 200.

The processing unit 300 processes the semiconductor device 10 with a predetermined heat treatment temperature and conveys the semiconductor device 10 into the cooling unit 400 maintained with a predetermined temperature when the heat treatment for the semiconductor device has been completed. The processing unit 300 selectively heats the amorphous silicon thin film or the metal thin film formed on the semiconductor device 10 by using the lamp heaters 320. In addition, the first and second black bodies 330 and 335 are also heated by means of heat generated from the lamp heater 320 and heat generated from the magnetic core 340 and the induction coil 350, thereby uniformly heating the semiconductor device 10, in particular, the glass substrate of the semiconductor device 10 and the support plate 20. At this time, the first and second black bodies 330 and 335 may emit infrared ray because of induction heating concentrated on predetermined portions of the first and second black bodies 330 and 335, so predetermined portions of the semiconductor device 10 can be heated with a relatively high temperature by means of the infrared ray.

The cooling unit 400 gradually cools the semiconductor device by using furnaces 410 having predetermined temperature levels, which are preset differently from each other corresponding to the steps of the heat treatment process, and conveys the semiconductor device 10 into the upper portion of the cooling susceptor 510 of the unloading unit 500.

Upon receiving the semiconductor device 10 from the cooling unit 400, the unloading unit 500 cools the semiconductor device 10 with a predetermined unloading temperature. At this time, the gas spraying nozzle 530 of the unloading unit 500 sprays cooling gas onto the upper and lower surfaces of the support plate 20 and the semiconductor device 10, thereby cooling the support plate 20 and the semiconductor device 10. When the support plate 20 is conveyed into the upper portion of the cooling susceptor 510 by means of the horizontal conveyance device (that is, rollers 540), the cooling susceptor 510 is moved upwards by means of the lifting device 520 so that the support plate 20 and the semiconductor device 10 are rested on the upper surface of the cooling susceptor 510. At this time, gas is sprayed onto the support plate 20 and the semiconductor device 10 through the spraying holes 514 of the cooling susceptor 510 so that the support plate 20 and the semiconductor device 10 are uniformly cooled. In addition, the upper heating device 550 applies heat to the support plate 20 and the upper surface of the semiconductor device 10, thereby preventing the support plate 20 and the semiconductor device 10 from being suddenly cooled. The unloading unit 500 conveys the semiconductor device to the next stage when the support plate 20 and the semiconductor device 10 rested on the upper surface of the cooling susceptor 510 have the temperature below 100° C. or the normal temperature, which may not cause deformation of the semiconductor device 10.

Figure 16:
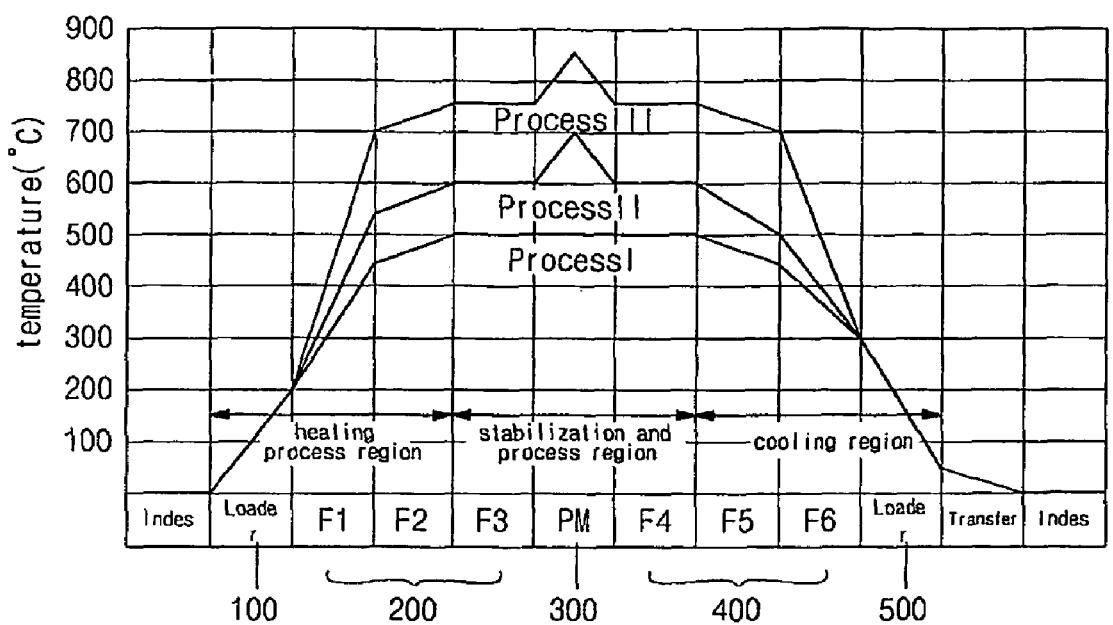
FIG. 16 is a graph illustrating process conditions of a heat treatment process performed by a heat treatment system according to one embodiment of the present invention.

FIG. 16 is a graph illustrating process conditions of the heat treatment process performed by the heat treatment system according to one embodiment of the present invention. In FIG. 16, the process (I) is carried out under a relatively low temperature of about 500° C. and includes a process for removing hydrogen remaining in the amorphous silicon thin film deposited on the glass substrate or a process for feeding hydrogen into the poly-crystalline silicon thin film deposited on the glass substrate. The process (II) is carried out at a temperature above 600° C. and includes a crystallization process for the amorphous silicon thin film formed on the glass substrate, a dopant activation process for the poly-crystalline silicon thin film, or the MIC and MICL processes. The process (III) is carried out at a temperature above 700° C. and includes a pre-compaction process for the glass substrate or a defect annealing process. The above processes are suggested as examples adaptable for the heat treatment system for the semiconductor device. However, the heat treatment system of the present invention can be applied to various processes besides the above processes.

If the heat treatment process is performed with the process conditions shown in FIG. 16, the loading unit 100 may preheat the support plate 20 and the semiconductor device 10 such that the semiconductor device 10 has the temperature of about 200° C., and conveys the semiconductor device 10 to the heating unit 200. The heating unit 200 heats the support plate 20 and the semiconductor device 10 through three heat treatment steps by using furnaces 210 having various heat treatment temperatures. The processing unit 300 heats the support plate 20 and the semiconductor device 10 up to a heat treatment temperature within a short period of time and cools the support plate 20 and the semiconductor device 10. As can be seen from the process (I) shown in FIG. 16, the processing unit 300 can be omitted from the heat treatment system if the heat treatment process does not require the processing unit 300. The cooling unit 400 gradually cools the semiconductor device 10 by using furnaces 410 until the semiconductor device 10 has a temperature of about 300° C. The unloading unit 500 also cools the support plate 20 and the semiconductor device 10 until the semiconductor device 10 has a temperature substantially identical to the normal temperature. At this time, as described above, the unloading unit 500 may include a separate cooling device in order to uniformly cool the support plate 20 and the semiconductor device 10 without causing deformation of the semiconductor device 10.

Therefore, the heat treatment system according to the present invention can perform the heat treatment process for the semiconductor device under the temperature range between 400 to 1000° C. In particular, the heat treatment system according to the present invention can effectively perform the heat treatment process for the semiconductor device at the temperature above 600° C., which is the deformation temperature of the glass substrate, without causing deformation of the semiconductor device 10.

Hereinafter, description will be made in relation to application examples of the heat treatment system for the semiconductor device according to the present invention.

Application Example 1

According to application example 1, the heat treatment system of the present invention is used for the SPC process of the amorphous silicon thin film deposited on the semiconductor device, that is, the glass substrate.

Figure 17:
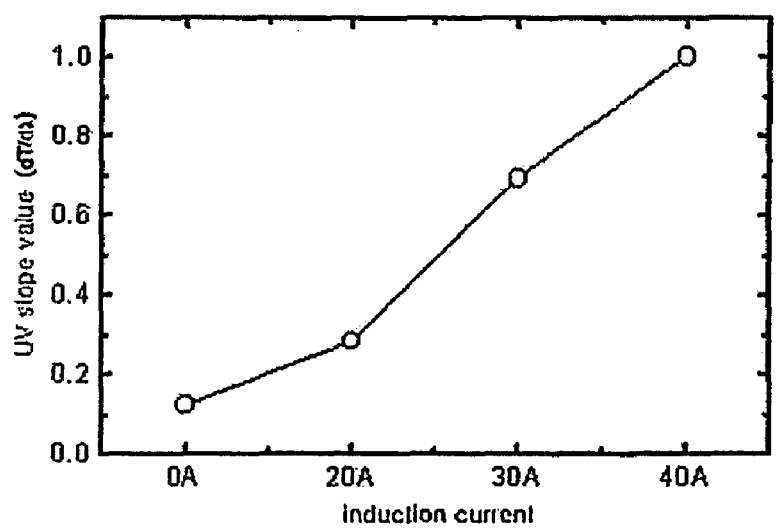
FIG. 17 is a graph illustrating a UV slope, which represents the crystallization degree of an amorphous silicon thin film as a function of current of an induction coil.
Figure 18A:
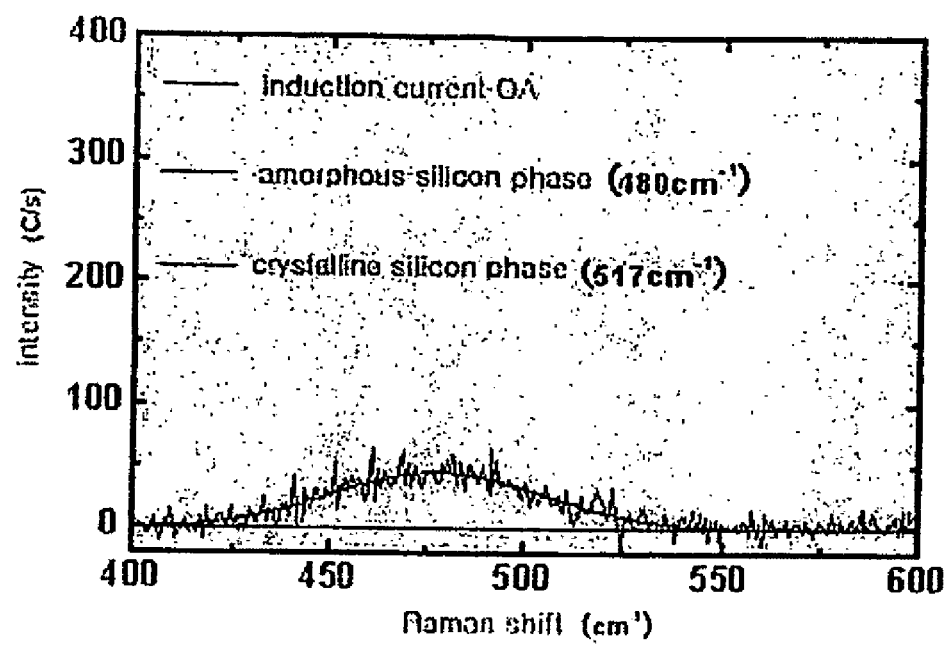
FIGS. 18a to 18d are graphs illustrating shifts of a Raman spectrum of a crystalline silicon thin film when current of an induction coil is 0 A, 20 A, 30 A and 40 A, respectively.
Figure 18B:
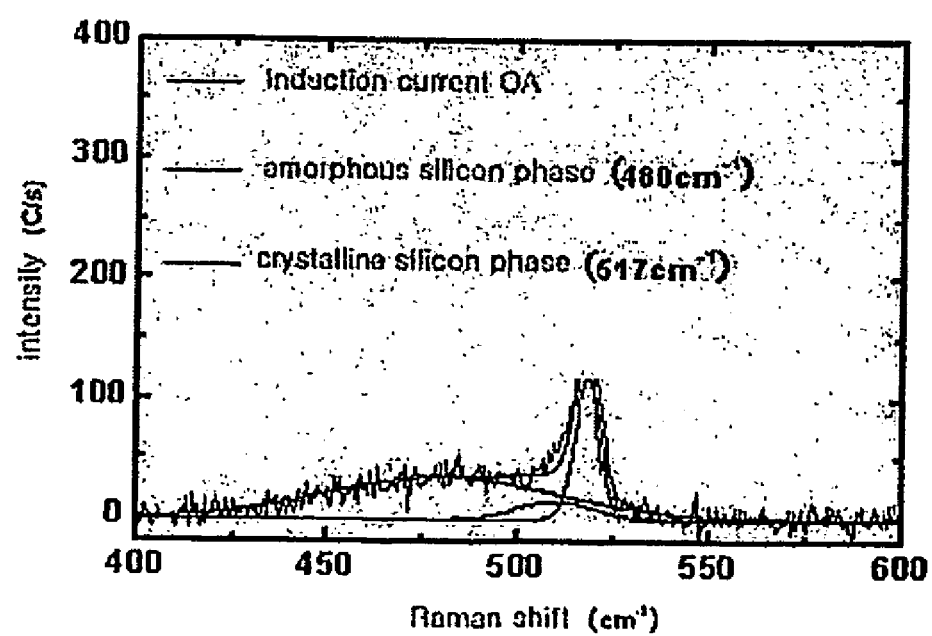
Figure 18C:
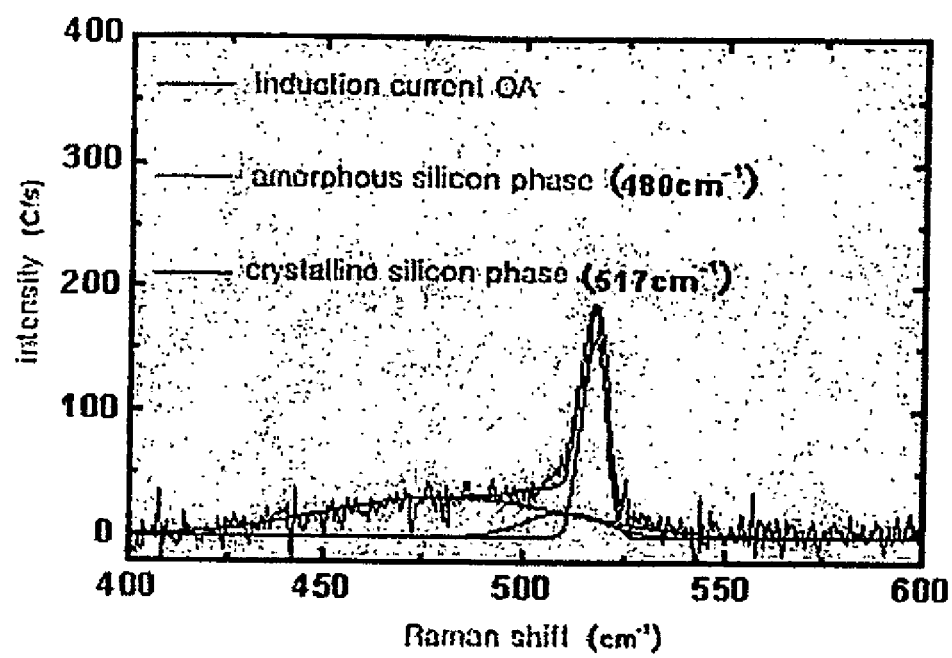
Figure 18D:
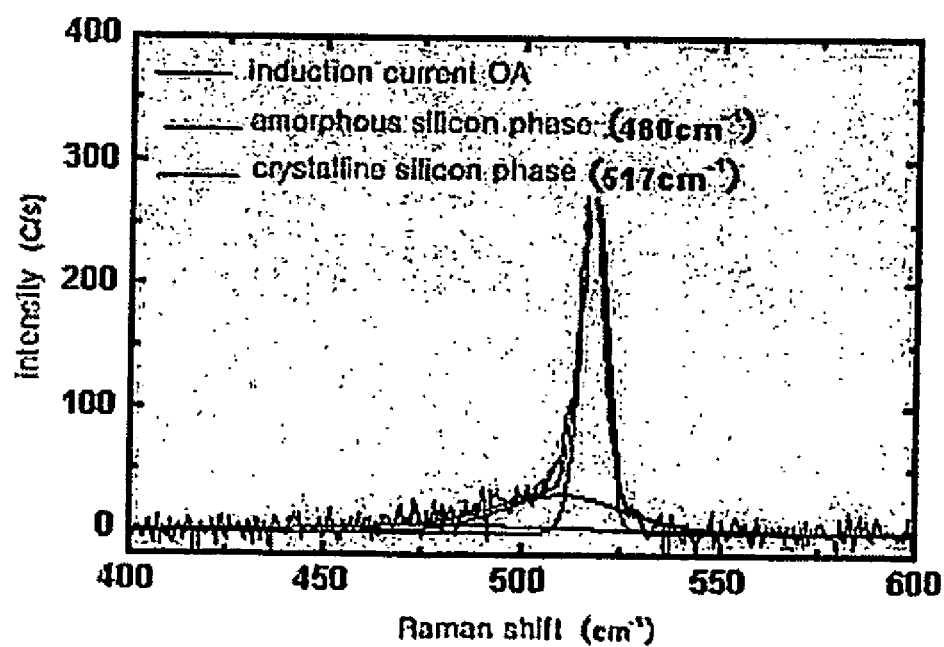

FIG. 17 is a graph illustrating a UV slope, which represents the crystallization degree of the amorphous silicon thin film as a function of current of the induction coil. That is, FIG. 17 shows the crystallization degree of the amorphous silicon thin film as a function of current of the induction coil under the same heat treatment time for the glass substrate, wherein an X-axis represents the current of the induction coil and a Y-axis represents the UV curve. The crystallization degree of the amorphous silicon thin film according to a UV transmittance spectrum may be estimated based on the UV slope value, wherein a silicon thin film having high quality crystalline can be obtained as the UV slope value becomes high.

FIGS. 18a to 18d are graphs illustrating shifts of a Raman spectrum of the crystalline silicon thin film when current of an induction coil is 0 A, 20 A, 30 A and 40 A, respectively, wherein an X-axis represents the Raman shift and a Y-axis represents intensity.

First, the glass substrate (product name: Corning 1737), on which the amorphous silicon thin film is deposited through a chemical vapor deposition process, is loaded on the support plate 20 and preheated at the temperature of about 200° C. in the loading unit 10. Then, the glass substrate and the support plate is conveyed into the heating unit 200 so that the support plate and the glass substrate are gradually heated up to the temperature of about 640° C., which is a desired preheating temperature required for solid phase crystallization of the amorphous silicon thin film. Then, the glass substrate and the support plate are conveyed into the processing unit 300, where the crystallization process for the glass substrate and the support plate is performed by instantly heating the glass substrate and the support plate. After that, the glass substrate and the support plate are cooled to the normal temperature by passing through the cooling unit 400 and the unloading unit 500. The heat treatment time for the SPC process in the processing unit 300 can be controlled through adjusting the conveying speed of the glass substrate and the support plate passing through the processing unit 300.

In addition, induction heating of the induction coil 350 can be controlled through adjusting an amount of current applied to the induction coil 350. As the amount of current is reduced, the temperature of induction heating applied to the first and second black bodies 330 and 335 is increased, so that the temperature of the glass substrate and the support plate 10 can also be increased. As shown in FIG. 17, if the current is not applied to the induction coil, the UV slope value is less than 0.2, representing that the crystallization for the silicon thin film is not performed. However, as the amount of current applied to the induction coil increases (20 A, 30 A or 40 A), that is, as intensity of induction heating increases, the crystallization for the silicon thin film may be promoted. When the current of 40 A is applied to the induction coil, the UV slope value exceeds 1, representing that the crystallization for the silicon thin film has been completed. In addition, as shown in FIGS. 18a to 18d, as the amount of current applied to the induction coil increases, the peak of the amorphous silicon phase becomes lowered and the peak of the crystalline silicon phase becomes higher. When the current of 40 A is applied to the induction coil, the crystallization degree of 95% is represented.

Application Example 2

According to application example 2, the heat treatment system of the present invention is used for the MILC process of the amorphous silicon thin film deposited on the semiconductor device, that is, the glass substrate.

Figure 19:
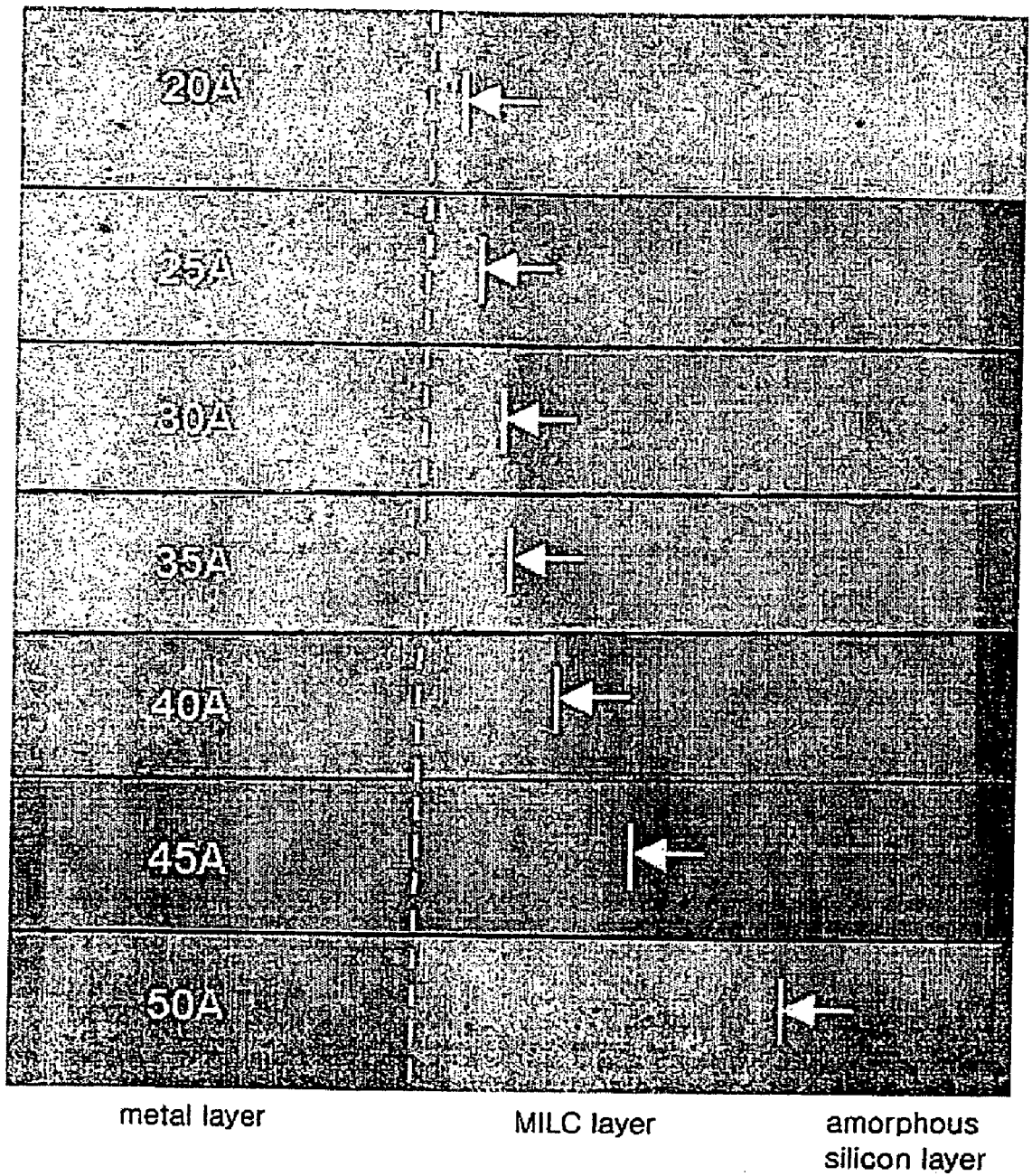
FIG. 19 is a view illustrating the growing length of an MILC layer as a function of current of an induction coil after an MICL process has been finished.

FIG. 19 is a view illustrating a growing length of an MILC layer as a function of current of the induction coil after the MICL process has been finished.

After depositing the amorphous silicon thin film on the glass substrate through the chemical vapor deposition process, a metal element (Ni) is coated on a predetermined portion of the amorphous silicon thin film in order to perform the MILC process. Herein, the MILC process is performed in the same manner as the crystallization process of application example 1, except that the preheating temperature of the furnace is set to 600° C., which is lower than that of application example 1. At this time, the processing unit 300 performs the heat treatment process while adjusting current applied to the halogen lamps of the lamp heater 320 so as to prevent the glass substrate from being deformed.

As shown In FIG. 19, as the amount of current applied to the induction coil increases, the growing length of the MILC layer becomes increased under the same heat treatment time. When the current of 40 A is applied to the induction coil, the crystalline silicon thin film is rapidly grown at a speed of about 3 to 4 μm/min from the amorphous silicon thin film.

Application Example 3

According to application example 3, the heat treatment system of the present invention is used for the dopant activation process to activate the dopant doped into the crystalline silicon thin film.

Figure 20:
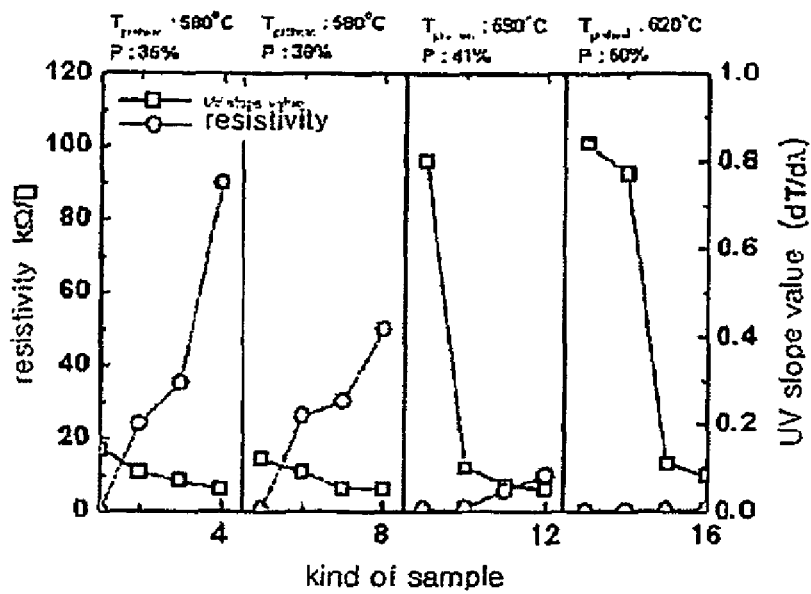
FIG. 20 is a graph illustrating variation of resistivity and a UV slope value as a function of a heating temperature of a processing unit and power of a halogen lamp.

FIG. 20 is a graph illustrating the activation degree of the dopant as a function of the heating temperature and power of halogen lamps.

After depositing the amorphous silicon thin film on the glass substrate through the chemical vapor deposition process, the amorphous silicon thin film is crystallized into the poly-crystalline silicon thin film through the ELC process. Then, after depositing a silicon dioxide ($SiO_2$) layer as an insulation layer, an n-type dopant is doped into the poly-crystalline silicon thin film by using doping equipment. According to application example 3, the dopant activation process is performed in the same manner as the crystallization process and the MILC process used in application examples 1 and 2, except that the preheating temperature of the furnace is set to 580 to 620° C., which is lower than that of application example 1. In addition, in order to promote the dopant activation, the dopant activation process is performed while varying the power of halogen lamps of the processing unit 300 in a range between 38 to 50%.

As shown in FIG. 20, the dopant activation degree is estimated by comparing the UV slope value representing the restoration degree of the crystalline according to the dopant activation process with a value of resistivity (RS) representing the electric activation degree of the dopant. According to the dopant activation process, accelerated dopants may collide with silicon (Si) ions during the ion implantation process thereby breaking the crystalline. Such broken crystalline may act as defects interrupting the electric activation of the dopant, thereby deteriorating reliability of the TFT. Thus, the broken crystalline must be restored during the dopant activation process, so the restoration degree for the broken crystalline may be a very important factor in the dopant activation process. As illustrated in FIG. 20, the resistivity becomes reduced and the UV slope value becomes increased as the current applied to the halogen lamp is increased. That is, the reduction of the resistivity represents that the doped dopant is activated and the increase of the UV slope value represents that the defects created during the ion implantation process have been cured so that reliability of the TFT device is improved.

Application Example 4

Temperature uniformity of the glass substrate is estimated in application example 4 by using the support plate during the crystallization process for the amorphous silicon thin film deposited on the glass substrate.

Figure 21:
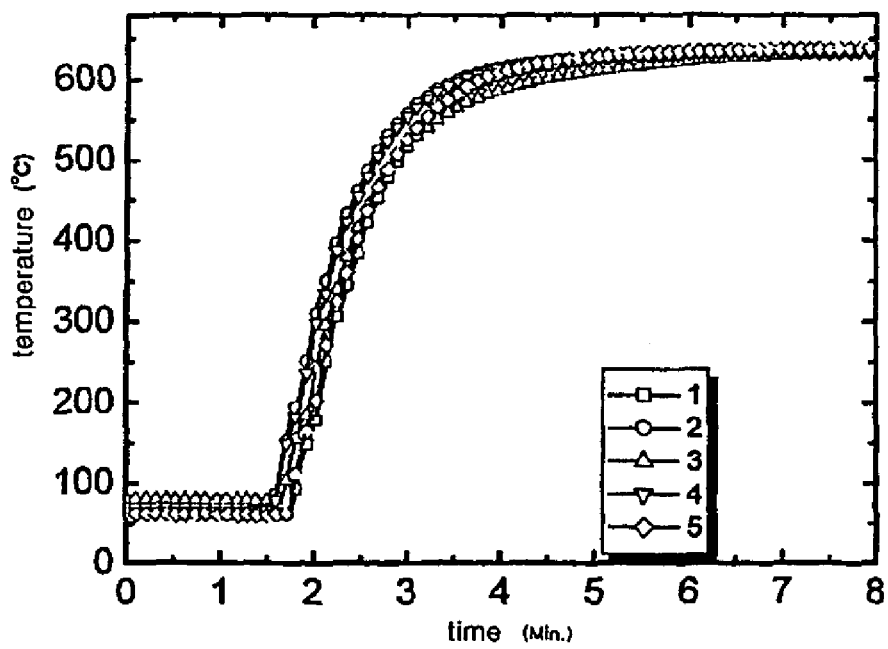
FIG. 21 is a graph illustrating temperature variation in various portions of a glass substrate as a function of time.

FIG. 21 is a graph illustrating temperature variation in various portions of the glass substrate as a function of time.

According to application example 4, the temperature uniformity of the glass substrate having a size of 370×470 mm and formed with the amorphous silicon thin film is estimated while raising the temperature of the glass substrate using the processing unit. In order to estimate the temperature uniformity of the glass substrate, thermocouples are attached to four edges and the central portion of the glass substrate and temperatures thereof are measured. As shown in FIG. 21, the temperature of the glass substrate is rapidly increased from the normal temperature to 500° C. within one minute after the glass substrate has been loaded. After four minutes have lapsed, the temperature of the glass substrate is increased up to 640° C. In addition, although the temperature of the glass substrate is rapidly increased, the temperature difference in the glass substrate is limited within a range of 30° C. In this case, the support plate may stably support the glass substrate even if the glass substrate is slightly deformed due to the above temperature difference, so the glass substrate can be prevented from being deformed under the high temperature atmosphere.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

What is claimed is:

1. A heat treatment system for a semiconductor device, the heat treatment system comprising:
a loading unit for conveying the semiconductor device and a support plate, on which the semiconductor device is rested, after preheating the semiconductor device and the support plate at a predetermined preheating temperature, wherein the loading unit includes a susceptor, which has at an upper center portion thereof insulative slots and on which the support plate is placed, a heating device for heating the susceptor, a lifting device for moving the susceptor up and down, and a horizontal conveyance device for horizontally moving the support plate;
a heating unit including at least two furnaces, the temperatures of which are individually controlled and increased step by step up to a predetermined heat treatment temperature for the semiconductor device, wherein the semiconductor device is adapted to be conveyed to the heating unit from the loading unit and heated at the predetermined heat treatment temperature by the heating unit;
a cooling unit including at least two furnaces, the temperatures of which are individually controlled and decreased step by step and between the predetermined heat treatment temperature and a predetermined cooling temperature, wherein the semiconductor device is adapted to be conveyed to the cooling unit from the heating unit and cooled at the predetermined cooling temperature by the cooling unit; and
an unloading unit for discharging the semiconductor device, after uniformly cooling the semiconductor device at a predetermined unloading temperature.

2. The heat treatment system as claimed in claim 1, further comprising a processing unit installed adjacent to the heating unit in order to heat the semiconductor device at a predetermined heat treatment temperature by using heat generated from a lamp heater and induction heat derived from induced electromotive force.

3. The heat treatment system as claimed in claim 1, wherein the susceptor is made from a material selected from the group consisting of aluminum, aluminum alloys, graphite, aluminum oxide, aluminum nitride, and boron nitride.

4. The heat treatment system as claimed in claim 1, wherein the susceptor has an area larger than an area of the support plate.

5. The heat treatment system as claimed in claim 1, wherein the insulative slots have an area corresponding to 20 to 70% of the area of the support plate rested on an upper surface of the susceptor.

6. The heat treatment system as claimed in claim 1, wherein a plurality of insulative slots are provided in form of trenches.

7. The heat treatment system as claimed in claim 6, wherein the width of each of the trenches is identical to or smaller than an interval between the trenches.

8. The heat treatment system as claimed in claim 6, wherein the width of a center portion of each of the trenches is larger than widths of both side ends of the trenches.

9. The heat treatment system as claimed in claim 1, wherein the insulative slots have polygonal sectional shapes.

10. The heat treatment system as claimed in claim 1, wherein the heating device is accommodated in the susceptor or positioned at a lower portion of the susceptor.

11. The heat treatment system as claimed in claim 1, wherein the heating device includes a resistance heater or a lamp heater.

12. The heat treatment system as claimed in claim 1, wherein the lifting device includes a pneumatic cylinder, a ball screw unit or a timing belt installed at a lower portion of the susceptor.

13. The heat treatment system as claimed in claim 1, wherein the horizontal conveyance device includes a roller and a motor for rotating the roller, the roller being accommodated in a roller recess formed at an upper surface of the susceptor with a predetermined length in order to convey the support plate making contact with an upper portion of the roller.

14. The heat treatment system as claimed in claim 2, wherein the processing unit includes an inner housing forming a heat treatment space for the semiconductor device, a lamp heater having a plurality of lamps installed at an inner upper portion or an inner lower portion of the inner housing, a first heat body having a single plate shape or consisting of a plurality of blocks and being installed in an area formed between the inner housing and the lamp heater, a magnetic core having a block shape and being installed at an outside of the inner housing corresponding to upper and lower portions of the inner housing, and an induction coil wound around the magnetic core.

15. The heat treatment system as claimed in claim 14, wherein the processing unit further includes a second heat body aligned in the inner housing in opposition to the first heat body about the semiconductor device.

16. The heat treatment system as claimed in claim 14, wherein the processing unit further includes a roller installed at a lower portion of the inner housing in order to convey the semiconductor device and the support plate while supporting the semiconductor device and the support plate.

17. The heat treatment system as claimed in claim 14, wherein the processing unit further includes an insulative plate installed between the inner housing and the magnetic core.

18. The heat treatment system as claimed in claim 14, wherein the lamp heater includes a halogen lamp.

19. The heat treatment system as claimed in claim 15, wherein the first and second heat bodies include silicon carbide or a carbon member coated with silicon carbide.

20. The heat treatment system as claimed in claim 17, wherein the inner housing and the insulative plate are made from quartz.

21. The heat treatment system as claimed in claim 14, wherein the induction coil is installed in an induction coil recess formed in the magnetic core while facing the inner housing.

22. The heat treatment system as claimed in claim 14, wherein the magnetic core is spaced from the insulative plate by a predetermined distance and is cooled by means of cooling gas fed onto the magnetic core from an exterior.

23. The heat treatment system as claimed in claim 14, wherein the magnetic core includes composite materials including epoxy and ferrite powder or iron.

24. The heat treatment system as claimed in claim 2, wherein the processing unit includes an inner housing forming a heat treatment space for the semiconductor device, a lamp heater installed at an inner upper portion and an inner lower portion of the inner housing, a heat body having a plate shape installed at an inner upper portion and an inner lower portion of the lamp heater, a magnetic core having a block shape and installed at an outside of the inner housing, and an induction coil wound around the magnetic core.

25. The heat treatment system as claimed in claim 24, wherein the heat body includes silicon carbide or a carbon member coated with silicon carbide.

26. The heat treatment system as claimed in claim 1, wherein the unloading unit includes a gas spraying nozzle for spraying gas to the support plate and the semiconductor device with a predetermined spraying angle when the support plate and the semiconductor device are conveyed to the unloading unit from the cooling unit, a cooling susceptor, which is formed at a predetermined region thereof with spraying holes for spraying gas and on which the support plate is rested, a lifting device for moving the cooling susceptor up and down, and a horizontal conveyance device for horizontally conveying the support plate.

27. The heat treatment system as claimed in claim 26, wherein the unloading unit further includes an upper heating device installed above the cooling susceptor in order to heat upper portions of the support plate and the semiconductor device.

28. The heat treatment system as claimed in claim 26, wherein the cooling susceptor is made from a material selected from the group consisting of aluminum, aluminum alloys, graphite, aluminum oxide, aluminum nitride, and boron nitride.

29. The heat treatment system as claimed in claim 26, wherein the cooling susceptor has an area larger than an area of the support plate.

30. The heat treatment system as claimed in claim 26, wherein the predetermined region of the cooling susceptor formed with the spraying holes has an area corresponding to at least 50% of the area of the support plate rested on an upper surface of the cooling susceptor.

31. The heat treatment system as claimed in claim 26, wherein the spraying holes have circular sectional shapes or polygonal sectional shapes.

32. The heat treatment system as claimed in claim 31, wherein each of the spraying holes has a diameter or a width in range of about 0.5 to 3 mm.

33. The heat treatment system as claimed in claim 26, wherein an interval between the spraying holes is larger than a diameter or a width of the spraying holes.

34. The heat treatment system as claimed in claim 26, wherein the gas spraying nozzle includes an upper nozzle and a lower nozzle, and the upper nozzle is spaced from the lower nozzle by a predetermined distance, which is larger than a total thickness of the semiconductor device and the support plate, in order to spray gas onto the upper and lower portions of the semiconductor device and the support plate.

35. The heat treatment system as claimed in claim 26, wherein the gas spraying nozzle sprays gas while forming an obtuse angle with respect to a conveying direction of the support plate.

36. The heat treatment system as claimed in claim 26, wherein a width of sprayed gas is at least the same as or larger than a width of the support plate.

37. The heat treatment system as claimed in claim 26, wherein the lifting device includes a pneumatic cylinder, a ball screw unit or a timing belt installed at a lower portion of the cooling susceptor.

38. The heat treatment system as claimed in claim 26, wherein the horizontal conveyance device includes a roller and a motor for rotating the roller, the roller being accommodated in a roller recess formed at an upper surface of the cooling susceptor with a predetermined length in order to convey the support plate making contact with an upper portion of the roller.

39. The heat treatment system as claimed in claim 27, wherein an installation area of the upper heating device installed above the cooling susceptor is larger than an area of the support plate so that the upper heating device effectively heats upper portions of the semiconductor device and the support plate.

40. The heat treatment system as claimed in claim 27, wherein the upper heating device includes a plurality of lamp heaters.

41. The heat treatment system as claimed in claim 1, wherein the semiconductor device includes a glass substrate, an amorphous silicon thin film deposited on the glass substrate, and a poly-crystalline silicon thin film deposited on the glass substrate.

42. The heat treatment system as claimed in claim 41, wherein the semiconductor device includes a thin film transistor used in a liquid crystal display or an organic light emitting display.

43. The heat treatment system as claimed in claim 2, wherein the heat treatment process includes one selected from the group consisting of a solid phase crystallization process for the amorphous silicon thin film, a metal induced crystallization process, a metal induced lateral crystallization process, an activation process for an ion-implanted poly-crystalline silicon thin film, and a pre-compaction process for the glass substrate.

44. The heat treatment system as claimed in claim 1, wherein the heat treatment process is performed in a temperature range of about 400 to 1000° C.

45. The heat treatment system as claimed in claim 1, wherein the semiconductor device is conveyed while being rested on the support plate made from quartz having a thickness of about 3 to 10 mm.

46. The heat treatment system as claimed in claim 45, wherein a width and a length of the support plate are larger than those of the semiconductor device by at least 10 mm.

47. The heat treatment system as claimed in claim 45, wherein the support plate is formed with at least four vacuum holes, which are diagonally aligned in an installation area of the semiconductor device.

48. The heat treatment system as claimed in claim 47, wherein the vacuum holes are aligned within 10 mm from lateral sides of the semiconductor device and have a circular shape having a diameter less than 3 mm or a rectangular shape having a width less than 3 mm.

49. A heat treatment system for a semiconductor device which is conveyed while being rested on a support plate, the heat treatment system comprising:
  a loading unit for heating the semiconductor device and the support plate at a predetermined preheating temperature,
  wherein the loading unit includes a susceptor, which is formed at an upper center portion thereof with insulative slots and on which the support plate is placed, a heating device for heating the susceptor, a lifting device for moving the susceptor up and down, and a horizontal conveyance device for horizontally moving the support plate.

50. A heat treatment system for a semiconductor device which is conveyed while being rested on a support plate, the heat treatment system comprising:
  an unloading unit for discharging the semiconductor device and the support plate, which have been heat-treated, after uniformly cooling the semiconductor device and the support plate at a predetermined unloading temperature, wherein
  the unloading unit includes a cooling susceptor, which is formed at a predetermined region thereof with spraying holes for spraying gas and on which the support plate is rested, a gas spraying nozzle installed at one side of the cooling susceptor in order to spray gas onto the support plate and the semiconductor device with a predetermined spraying angle when the support plate and the semiconductor device are conveyed into the unloading unit, a lifting device for moving the cooling susceptor up and down, and a horizontal conveyance device for horizontally conveying the support plate.

51. The heat treatment system as claimed in claim 50, wherein the unloading unit further includes an upper heating device installed above the cooling susceptor in order to heat upper portions of the support plate and the semiconductor device.

* * * * *